(12) United States Patent
Mathur et al.

(10) Patent No.: US 11,803,207 B1
(45) Date of Patent: Oct. 31, 2023

(54) REFERENCE INDEPENDENT AND NOISE INSENSITIVE GLITCH FREE CLOCK MULTIPLEXER

(71) Applicant: SanDisk Technologies LLC, Addison, TX (US)

(72) Inventors: Shiv Harit Mathur, Bangalore (IN); Avinash Pandit, Near Khanpur (IN)

(73) Assignee: SANDISK TECHNOLOGIES LLC, Addison, TX (US)

(*) Notice: Subject to any disclaimer, the term of this patent is extended or adjusted under 35 U.S.C. 154(b) by 0 days.

(21) Appl. No.: 17/733,662

(22) Filed: Apr. 29, 2022

(51) Int. Cl.
*G06F 1/10* (2006.01)
*H03K 3/037* (2006.01)
*H03K 19/20* (2006.01)

(52) U.S. Cl.
CPC ............. *G06F 1/10* (2013.01); *H03K 3/037* (2013.01); *H03K 19/20* (2013.01)

(58) Field of Classification Search
None
See application file for complete search history.

(56) References Cited

U.S. PATENT DOCUMENTS 10,530,370 B1 * 1/2020 Mohan ............... H03K 19/20
2013/0043917 A1 * 2/2013 de Cesare ............ H03L 7/07
327/150

* cited by examiner

*Primary Examiner* — Cassandra F Cox
(74) *Attorney, Agent, or Firm* — Hector A. Agdeppa; SHEPPARD, MULLIN, RICHTER & HAMPTON LLP

(57) ABSTRACT

Systems and methods disclosed herein provide for an improved glitch-free clock multiplexer exhibiting noise insensitivity with reduced power consumption and reduced physical area on a chip. The embodiments disclosed herein operate without any need of a reference clock. Due to which, clock interchangeability is possible at any point of time. An example glitch-free clock multiplexing according to the embodiments disclosed herein utilize a plurality of clock path circuits, each corresponding to a clock. The clock path circuits are activated responsive to a system startup signal. Based on a clock selection, the embodiments herein deactivate clock path circuits for unselected clocks and, dependent on the deactivation of the unselected clock path circuits, activate clock path circuits of any selected clocks.

19 Claims, 21 Drawing Sheets

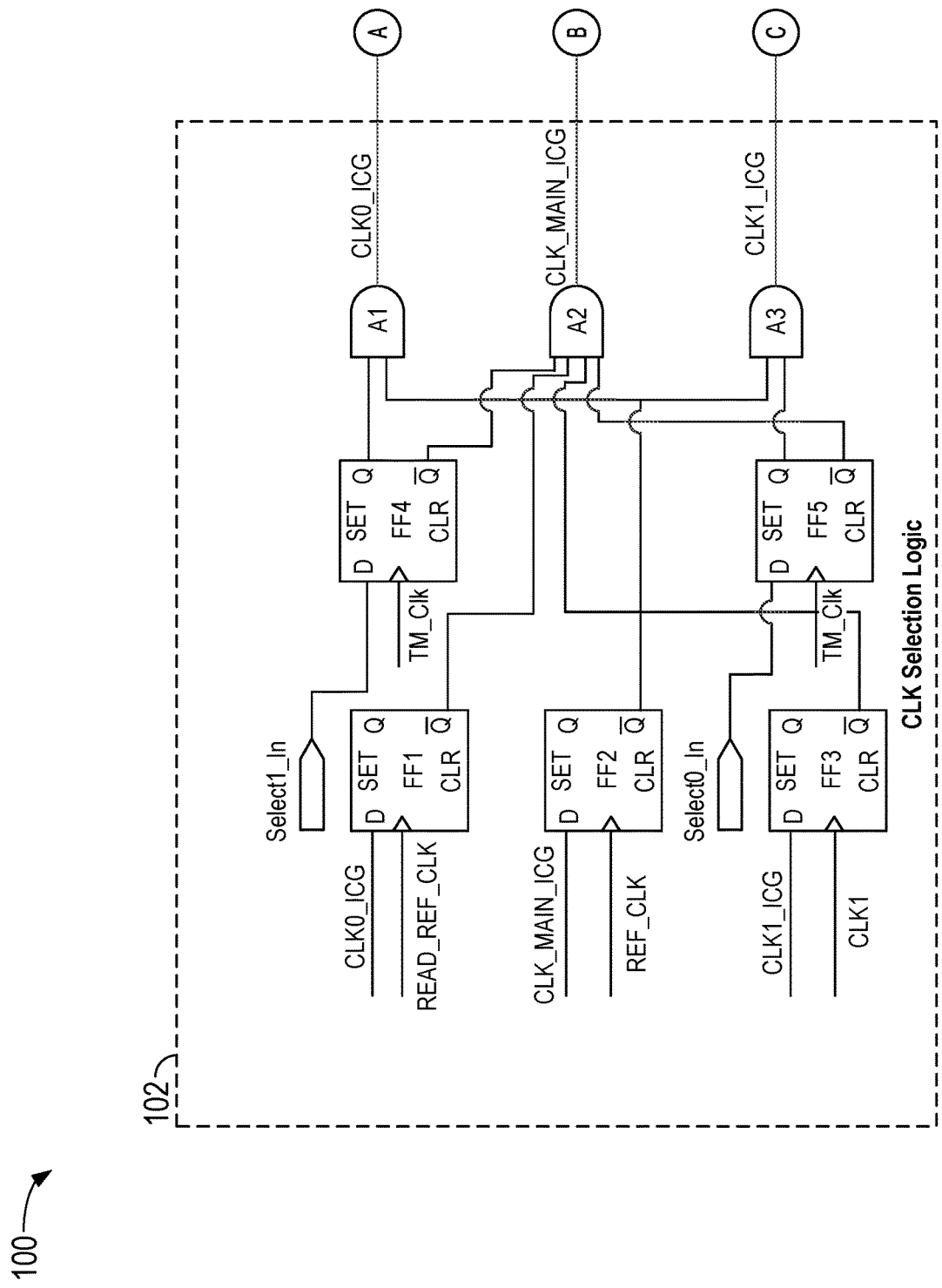

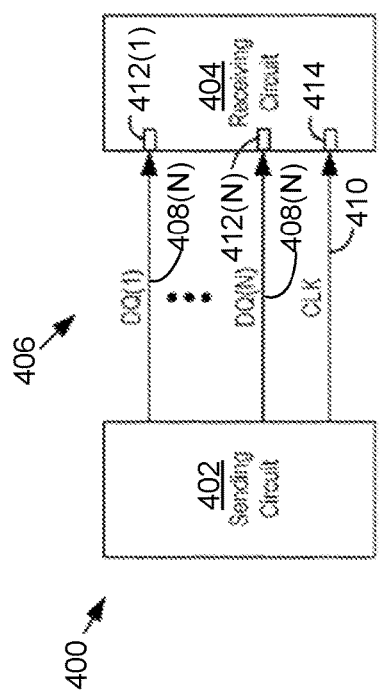
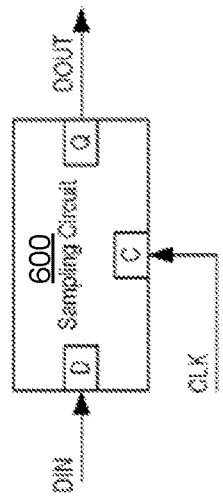
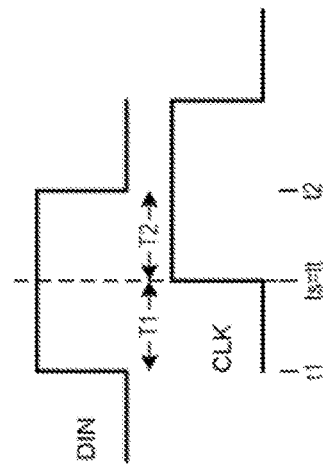
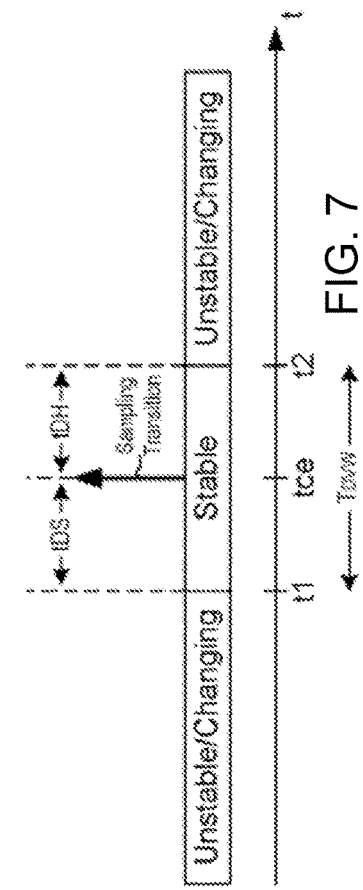
FIG. 4
FIG. 5
FIG. 6
FIG. 7
FIG. 8

US 11,803,207 B1

REFERENCE INDEPENDENT AND NOISE INSENSITIVE GLITCH FREE CLOCK MULTIPLEXER

BACKGROUND

Integrated circuit (IC) designs, such as System-on-Chip (SOC), rely on multiple circuit modules or intellectual property (IP) blocks that need to interact harmoniously with each other to achieve the desired functionality. The multiple circuit modules may operate at different clock frequencies. An individual circuit module can also operate at different clock frequencies depending on the state of the IC. For example, the IC may require certain circuit modules be turned on and off or to be run at different clock frequencies depending on the state of the system. Thus, switching the source of a clock signal while the chip is running is often necessary. This generally implemented by multiplexing two different frequency clock sources in hardware and controlling the multiplexer select line by internal logic. These clock frequencies may not be synchronous with respect to each other (e.g., asynchronous), and they may not be synchronous with respect to a reference clock signals. Even when the signals are synchronous, the phase differences can create a glitch or short cycled output clock. A glitch on the clock line can affect the whole system, as it could be interpreted as a capture clock edge by some registers while missed by others.

BRIEF DESCRIPTION OF THE DRAWINGS

The present disclosure, in accordance with one or more various embodiments, is described in detail with reference to the following figures. The figures are provided for purposes of illustration only and merely depict typical or example embodiments.

FIGS. 1A and 1B depict a circuit implementation of a glitch-free multiplexer.

FIG. 4 is a block diagram of an example system that includes a sending circuit and a receiving circuit.

FIG. 5 is an example timing diagram of a data signal.

FIG. 6 is a block diagram of an example sampling circuit.

FIG. 7 is a schematic diagram of setup and hold time requirements of the sampling circuit of FIG. 6.

FIG. 8 is a timing diagram of a sampling transition of a clock signal in a target sampling position.

The figures are not exhaustive and do not limit the present disclosure to the precise form disclosed.

DETAILED DESCRIPTION

An IC may include multiple circuit modules that may be turned on and off or ran at different clock frequencies depending on the state of the system. Clock multiplexing is often used in IC design to switch between the different clock frequencies. As IC design attempts to reduce the delays in the circuit datapath, uncertainty in the clock can be detrimental to the IC functionality. Glitch-free clock multiplexing serves to select and/or switch between asynchronous clock signals while protecting downstream logic from clock glitches by providing a glitch-free output clock signal.

Figure 1B:
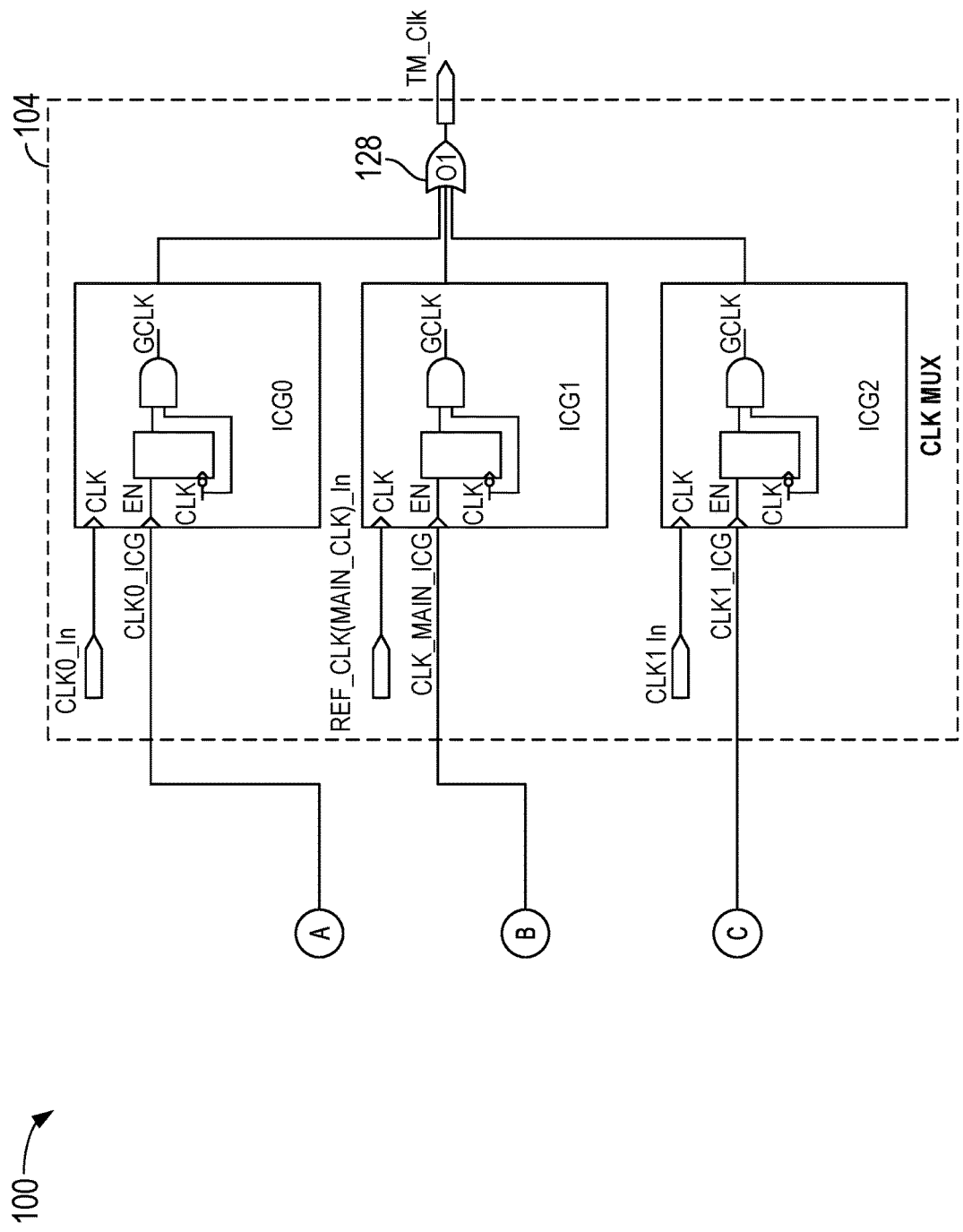

Glitch-free multiplexers, such as those having the example architecture depicted in FIGS. 1A and 1B, are used widely across industry to select between multiple clock signals. FIGS. 1A and 1B depict an example glitch-free multiplexer architecture 100 that provides for glitch free change over from one clock source to another clock source so downstream IP blocks (not illustrated) may utilize the output clock signal (illustrated in FIGS. 1A and 1B as TM_Clk) without negatively impacting their functionality or behaving erroneously.

The architecture 100 includes a clock selection logic block 102 and a multiplexer block 104. The clock selection logic block 102 provides controls to select a given clock, while the multiplexer block 104 selects the clock and converges the selected clock to the clock output TM_CLK. FIGS. 1A and 1B illustrates an example multiplexer block 104 which includes integrated clock gaters ICG1-ICG3, which each provide for glitch free clock pass through when change over from one clock source to another clock source occurs.

In the above example, the architecture 100 is provided to select between three clock inputs (e.g., CLK0, Ref_CLK, and CLK1), each of which are input into ICG1-ICG3, respectively, as shown by CLK0_in, Ref_CLK_in, and CLK1_in. Selection signals having bits Select0 and Select1 are input into flip-flops FF4 and FF5, respectively, of the clock selection logic block 102 as Select1_in and Select0_in. Select0 and Select1 are provided for selecting between the three clock inputs as described below.

In operation, during a system reset or startup, the clock selection logic block 102 keeps REF_CLK active due to AND gate A2 forcing output as 1. Startup or reset may refer to an initial condition on the flip-flops. For example, at reset or startup, the outputs of $\overline{Q}$ from flip-flops FF1, FF2, FF3, FF4, and FF5 are at a logic high level (also referred to as a logic high state), while outputs of Q are at a logic low level (also referred to as a logic low state). Thus, AND gate A2 outputs a logic high level (e.g., "1") to the ICG1, while AND gates A1 and A2 output logic low levels (e.g., "0"). Thus, the ICG0 and ICG2 do not output a global clock (e.g., GCLK) to OR gate O1. The ICG1 outputs the REF_CLK as GCLK to the OR gate O1, which provides the REF_CLK as output clock signal TM_Clk.

Any change in selection bit (e.g., change bit Select1_in and/or Select0_in) propagates to the multiplexer block 104 only after the REF_CLK is active. For example, an active REF_CLK is required by A1 and A3 to pass CLK0_ICG and/or CLK1_ICG.

When Select0_in and Select1_in are both set to a logic low level (e.g., "0"), indicating no change in clock selection, REF_CLK will be selected as the output clock and any glitch present in the input clock source (e.g., REF_CLK_in) will be removed by ICG1. When CLK1 is desired, Select0_in is set to the logic high level (e.g., "1") and Select1_in is set to the logic low level. Thus, CLK1 will be selected as the output clock and any glitch in CLK1_in will be removed by ICG2. In a case where CLK0 is desired, Select0_in is to the logic low level and Select1_in is set to the logic high level. Thus, CLK0 will be selected as the output clock and any glitch on CLK0_in will be removed by ICG0.

However, the architecture 100 suffers from various technical problems, particularly when both Select0_in and Select1_in are set to the logic high level. This can occur in noisy environments, for example, where changes in background noise causes power droops. In the case of a rise in power due to a power droop from a noisy environment, one or both selection input signals may have a sudden increase in power or voltage due to the power droop resulting in a logic high level. For example, the supply of input signal(s) may have noise, thus the input signal(s) would have jitter. In an input signal is desired to be changed from 01 to 10, the jitter could result in a change from 11 instead of 10. This jitter induced selection results in an unwanted clock selection, which is not acceptable.

In another scenario, delays in the datapath may cause multiple selection input signals set to a logic high level. For example, a delay in a control circuit that generates the selection input signals or from other selection signal source. In this case, a large enough delay in on a first selection input signal (for example, Select0_in) may result in an earlier selected high level for Select0_in reaching clock selection logic block 102 at the same time as a later selected high level selection input signal (for example, Select1_in). When this occurs, CLK1 and CLK0 are selected and each ICG0 and ICG2 a GCLK signal as CLK0 and CLK1, respectively. Thus, the OR gate O1 outputs two simultaneous signals that interfere, resulting a glitch where the clock is "undefined" and/or there is "no clock." For example, an "undefined" clock occurs where the resulting output clock signal TM_Clk does not correspond to a clock used by the system. This output clock signal, if it exists, is then propagated to downstream IP blocks, whose functionality will fail due to improper clock synchronization.

Figure 2:
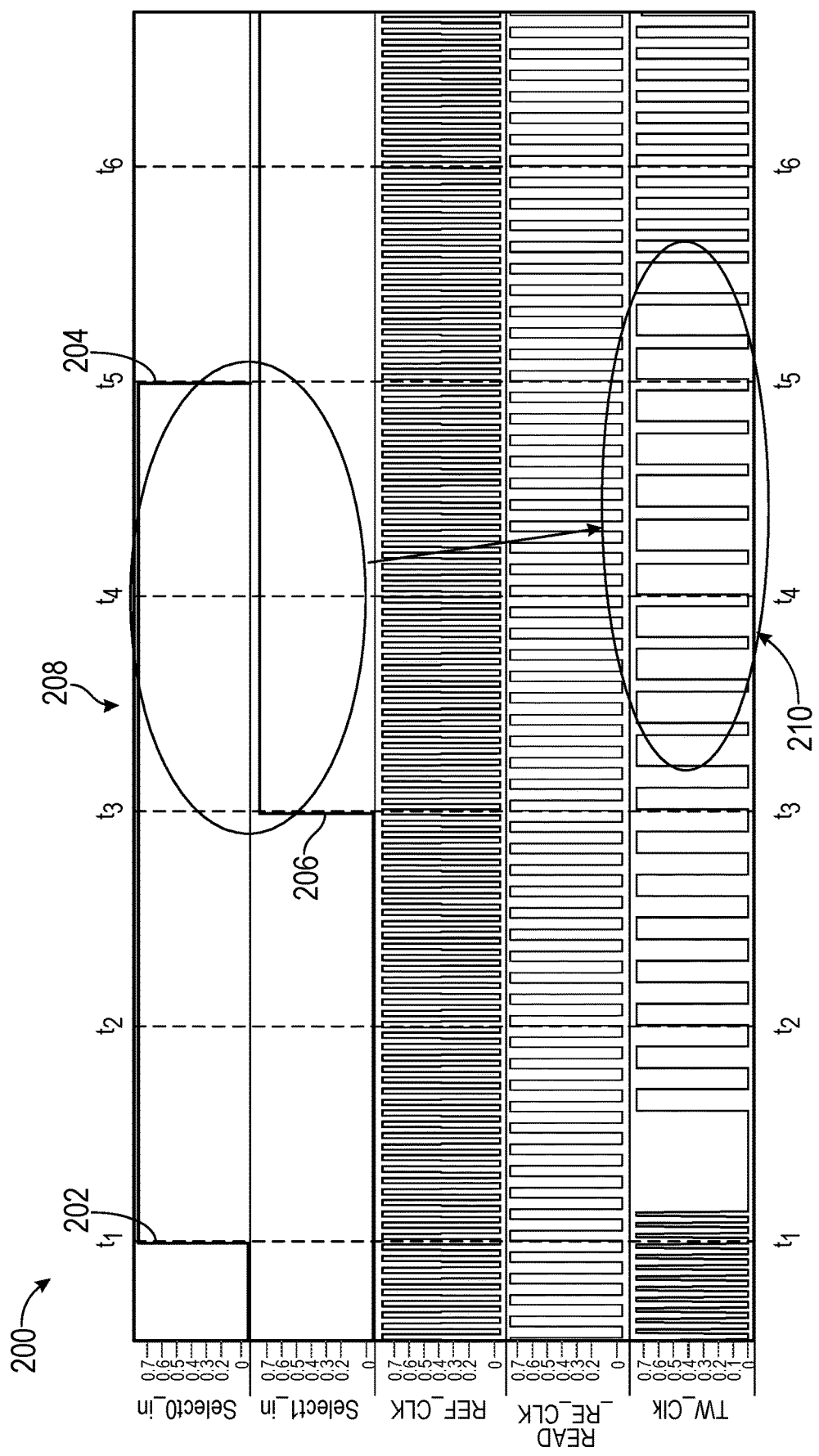
FIGS. 2 and 3 are timing diagrams illustrating example failures of the glitch-free multiplexer of FIGS. 1A and 1B.

FIG. 2 is a timing diagram 200 illustrating the above-described example failure of the architecture 100 when Select0_in and Select1_in are both set to the high state (e.g., 1). FIG. 2 shows various signals, and relevant events are marked with reference numerals 202-210. It can be seen that a first input selection signal (Select0_in) is set to logic high level (e.g., 1) on at time $t_1$ (202) and a second input selection signal (Select1_in) is set to logic high level at time $t_3$ (204). Then at time $t_5$ (204) Select0_in is deselected and set to logic low level (e.g., 0). Thus, for the time between $t_3$ and time $t_5$ (208), both Select0_in and Select1_in are set to logic high level, during which 100 outputs two simultaneous clock signals on TM_Clk that interfere and result an "undefined" or no clock. This output clock signal TM_Clk is propagated to downstream IP blocks causing functionality failure due to the clock signal failing to correspond to clock defined for the system. The only option in the event of an undefined or no clock is to power boot the circuit.

A further technical problem associated with 100 is that the 104 requires an active REF_CLK to operate. Most of the time it may be challenge at system level to be required to rely on the REF_CLK in all cases. For example, in various conventional systems, due to high dependency on power, especially on handheld devices, there are many power down modes. Thus, to ensure the circuit operates correctly, REF_CLK can never be shut down, which will be a hit on power budget. However, REF_CLK cannot be shut down in architecture 100, because it would completely fail if REF_CLK is absent post reset or startup.

Figure 3:
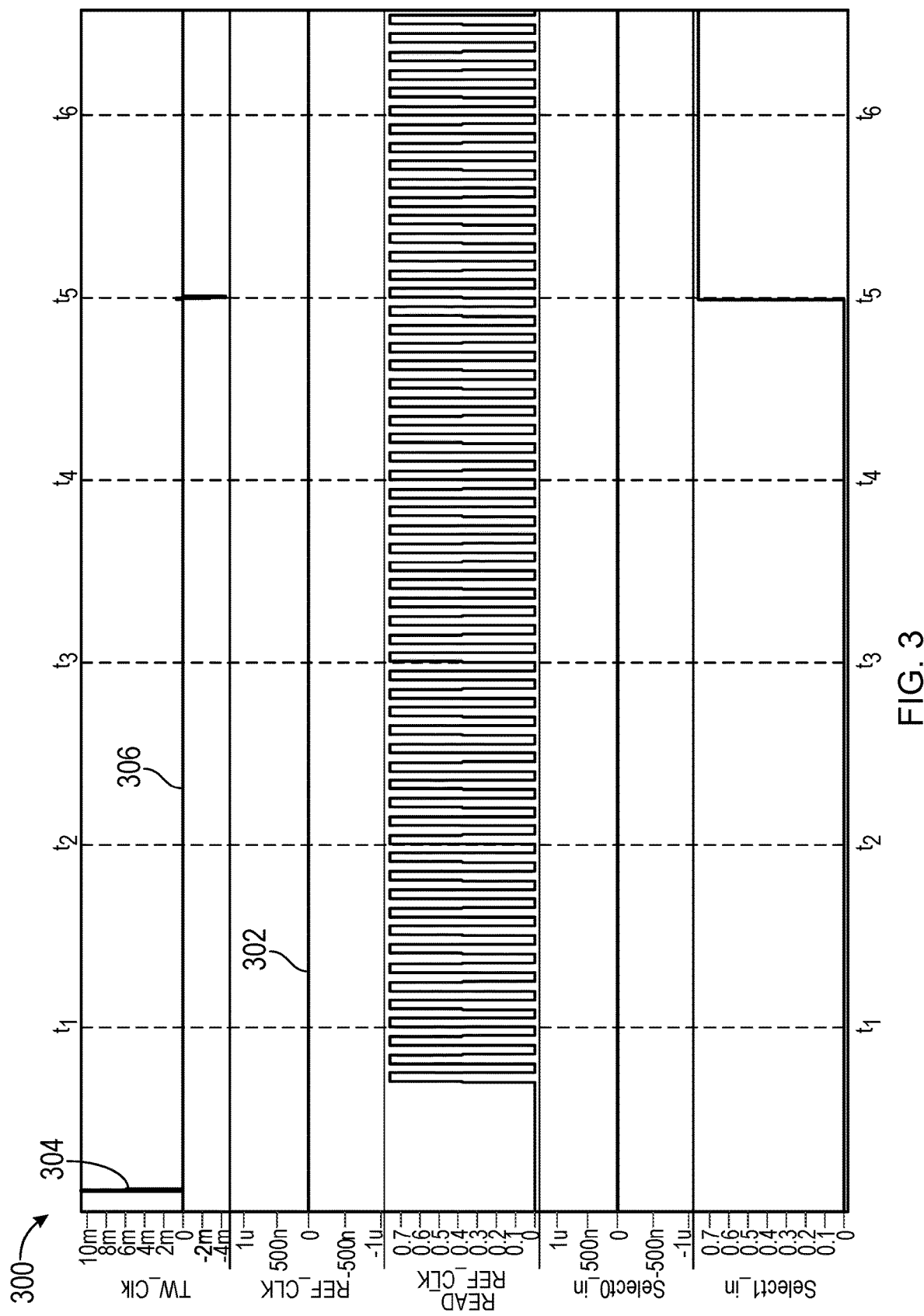

FIG. 3 is a timing diagram 300 illustrating the above noted example failure of the architecture 100 when REF_CLK is absent. FIG. 3 shows various signals, and relevant events are marked with reference numerals 302-306. It can be seen that the REF_CLK signal is absent (302), e.g., zero. Since REF_CLK is not present, post reset (power droop 304), architecture 100 fails to propagate any clock at the output TM_Clk (306). This output results in functionality failure due to the absence of any global clock.

One approach proposed to address the above technical problems is to switch the selection input signals separately at different times. For example, to change the selection bit of the selection input signal from 0 for Select0_in and 1 for Select1_in, a possible change is to first set Select1_in to the logic low level (e.g., both bits set to 0) and, once the switch has settled, change Select0_in to the logical high level. While this approach may avoid the problem of both selection bits being set to logic high level, the approach still requires REF_CLK to be active at all times during operation. Doing so, results in higher power consumption to enable and maintain the REF_CLK path, for example, 10-20% increments in power consumption. Furthermore, as noted above, it may not always be feasible to ensure that REF_CLK is always active and available.

Embodiments of the disclosed technology relate to an improved glitch-free clock multiplexer and corresponding circuit implementation and method of operation exhibiting noise insensitivity with reduced power consumption and physical area on a chip. The embodiments disclosed herein operate without any need of a reference clock. Due to which, clock interchangeability is possible at any point of time. The embodiments are therefore insensitive to noise and robust against noisy environment and delays in selection signals. Furthermore, embodiments disclosed herein are independent of any clock source switch irrespective of other clock availability.

More specifically, and as will be described in more detail later in this disclosure, embodiments herein provide for glitch-free clock multiplexing using a plurality of clock path circuits, each corresponding to a clock. The clock path circuits are activated responsive to a system startup signal. Based on a selection signal indicative of a clock, the embodiments herein deactivate clock path circuits for unselected clocks and, dependent on the deactivation of the unselected clock path circuits, activate clock path circuits of any clock indicated in the selection signal. Because each of the clock path circuits are activated after startup (e.g., reset or initial startup), a reference clock is not required for operation. Further, removing the requirement of a reference clock reduced power consumption since power is no longer needed to maintain the reference clock operation.

Additionally, because embodiments disclosed herein operate on the concept of deactivating unselected clocks first and then activating the clock path circuit for the selected clock, the embodiments disclosed herein are insensitive to noise, such as power droops in noisy environments, and to delays along the datapath. The embodiments disclosed herein are capable of resolving the selection (e.g., both selection bits set to logic high levels), which provides for noise and delay insensitivity as well as providing another selection state for clock selection, that was not available in prior art systems.

The embodiments herein are applicable for merging different clocks for various applications. For example, deep power down mode (DPDM) entry and exit, clock detections, garbage collection schemes, and power optimization function. Furthermore, the embodiments disclosed herein provide for improved performance in overall systems and retain low power profile on power sources, such as batteries which may be limited in certain devices (e.g., handheld devices). Further still, the embodiment disclosed herein provide chip real-estate savings in the clock tree that is connected to the multiplexer. For example, embodiments disclosed herein are able to provide for clock trees that require 2-3% less physical real-estate due.

As previously noted, the existing glitch-free clock multiplexers design described above suffer from the technical problems of requiring a reference clock at all times, and, because of being sensitive to noisy environment and/or delays in the data path, selecting an undefined clock or no clock is present. Improved glitch-free clock multiplexers according to embodiments of the disclosed technology provide a technical solution to these technical problems by activating circuit paths for each clock upon startup, thereby removing the reliance on the reference clock. In addition, glitch-free clock multiplexers according to embodiments of the disclosed technology are able to be robust against noisy environments and selection signal delays by deactivating unselected clocks and, dependent on the deactivation, activating only the selected clocks. Thus, glitch-free clock multiplexers according to embodiments of the disclosed technology do not suffer from the technical problems associated with the other approaches discussed above.

The embodiments disclosed herein may be used in various technologies that utilize IC to provide glitch-free clock multiplexing. For example, various memory systems rely on a clock signal to coordinate transfer and storage of data in an associated data signal. With continued advances to these memory systems, the aligning the appropriate clock signal more precisely and free of glitch with its associated data signals remains a source of technological problems these memory systems face. Thus, the present disclosure provides for glitch-free clock multiplexers that provide improvements to various technologies, such as related to the transfer and storage of data in memory systems.

FIG. 4 shows one embodiment of a system 400 in which one or more data/clock circuits may be implemented. The system 400 includes a sending circuit 402 and a receiving circuit 404 configured to communicate with each other via a communications bus 406. Both the sending circuit 402 and the receiver circuit 404 may be transceiver circuits, which can be configured to transmit and receive signals. For simplicity, with reference to FIG. 4, one of the circuits 402 is designated as the sending circuit 402 and the other circuit 404 is designated as the receiving circuit 404.

Additionally, in particular example configurations, each of the sending circuit 402 and the receiving circuit 404 are IC. In general, an IC—also referred to as a monolithic IC, a chip, or a microchip—is an assembly or a collection of electric circuit components (including active components, such as transistors and diodes, and passive components, such as capacitors and resistors) and their interconnections formed as a single unit, such as by being fabricated, on a substrate typically made of a semiconductor material such as silicon. For such embodiments, the sending circuit 402 and the receiving circuit 104 are separate integrated circuits, and the communication bus 406 is configured to communicate signals external to the separate sending circuit (IC) 402 and the receiving circuit (IC) 404.

The sending circuit 402 is configured to send a clock signal CLK and a plurality of data signals DQ to the receiving circuit 404 via a communications bus 406. Otherwise stated, the receiving circuit 404 is configured to receive a clock signal CLK and a plurality data signals DQ from the sending circuit 402 via the communications bus 406. The plurality of data signals DQ are shown in FIG. 4 as including data signals DQ(1) to DQ(N), where N is two or more. For particular example configurations, N is 8, although other integer numbers of two or more may be possible for other example configurations.

From the perspective of the sending circuit 402, the clock signal CLK is an output clock signal, and the data signals DQ are output data signals in that they are the clock and data signals that the sending circuit 402 outputs to the receiving circuit 404. From the perspective of the receiving circuit 404, the clock signal CLK is an input clock signal, and the data signals DQ are input data signals in that they are the clock and data signals that the receiving circuit 404 receives from the sending circuit 402.

The communications bus 406 includes data lines 408(1) to 408(N) between the sending circuit 402 and the clock circuit 404. The receiving circuit has data input contacts 412(1) to 412(N), which are in physical and electrical contact with the respective data lines 408(1) to 408(N). The data input contacts 412(1) to 412(N) could be pins, pads, etc. The sending circuit 102 is configured to send the data signals DQ(1) to DQ(N) simultaneously and/or in parallel over the data lines 408(1) to 408(N) to the receiving circuit 404. Otherwise stated, the receiving circuit 404 is configured to receive the data signals DQ(1) to DQ(N) simultaneously and/or in parallel from over the data lines 408(1) to 408(N).

In addition, the communications bus 406 includes one or more clock lines 410 between the sending circuit 402 and the receiving circuit 404. The receiving circuit has one or more clock input contacts 414, which is/are in physical and electrical contact with the respective one or more clock lines 410. The clock input contact(s) could be pins, pads, etc. As described in further detail below, the input clock signal CLK may include a single-ended clock signal or a pair of complementary clock signals (e.g., CLK and CLKB). Where the input clock signal CLK is a single-ended clock signal, the one or more clock lines 410 may include a single clock line. Where the input clock signal CLK is a pair of complementary clock signals CLK, CLKB, the one or more clock lines 410 may include two clock lines. The sending circuit 402 may be configured to transmit each clock signal CLK, CLKB of the complementary pair over a respective one of the two clock lines 410. The receiving circuit 404 is configured to receive the input clock signal CLK—either as a single-ended clock signal or as a pair of complementary clock signals—simultaneously and/or in parallel with the input of data signals DQ(1) to DQ(N).

The sending circuit 402 and the receiving circuit 404 form a source synchronous system 400. A source synchronous system is a system in which a source circuit sends a data signal along with a clock signal to a destination circuit in order for the destination circuit to use the clock signal to identify the data values of the data signal. In the system 400, the sending circuit 402 is the source circuit, and the receiving circuit 404 is the destination circuit. However, as transceiver circuits, the sending circuit 402 and the receiving circuit 404 may change roles. For example, in certain operations, circuit 404 sends a clock signal and a data signal to circuit 402, and circuit 402 uses the clock signal to identify the data values of the data signal. For such operations, the circuit 404 becomes the sending or the source circuit, and the circuit 402 becomes the receiving or the destination circuit.

In general, a signal, such as the input clock signal CLK and the input data signals DQ may be at a level at a given point in time. As used herein, a level of a signal is a magnitude value, such as a voltage magnitude value or a current magnitude value. In some cases, the signal may be referred to as being at a high level or at a low level, transitioning between a high level and a low level, or transitioning between a low level and a high level. A high level of a signal may be a single high level, a level that is within a set or range of high levels, a maximum high level or a minimum high level of a set or range of high levels, or an average high level of a set or range of high levels. Similarly, a low level of a signal may be a single low level, a level that is within a set or range of low levels, a maximum low level or a minimum low level of a set or range of low levels, or an average low level of a set or range of low levels.

With reference to FIGS. 5, a high level of a signal is a level that is at or above a minimum high level $V_{H\_MIN}$, and a low level of the signal is a level that is at or below a maximum low level $V_{L\_MAX}$. The minimum high level $V_{H\_MIN}$ and the maximum low level $V_{L\_MAX}$ may be predetermined levels or values, and in particular example configurations, predetermined levels or values specified as part of a swing requirement with which the source circuit 402 is configured to comply when transmitting the signal. A signal that transitions according to and/or in compliance with the swing requirement transitions to a high level that is at or above the minimum high level $V_{H\_MIN}$ of the swing requirement, and transitions to a low level that is at or below the maximum low level $V_{L\_MAX}$ of the swing requirement.

In general, a signal performs transitions between its high level and its low level. A given transition of a signal may be one of two transition types, including a rising transition and a falling transition. A signal performs a rising transition when the signal transitions from its low level to its high level, and performs a falling transition when the signal transitions from its high level to its low level.

A portion of a magnitude waveform of a signal over a transition is referred to as an edge. In particular, a portion of the magnitude waveform over a rising transition is a rising edge and a portion of the magnitude waveform over a falling transition is a falling edge.

Also, a clock signal, such as the input clock signal CLK, is a signal that has repetitive cycles occurring over successive periods T. Within a cycle, one of the portions is at a high level and the other portion is at a low level. Accordingly, the portions may be defined by consecutive rising and falling transitions or edges of the clock signal. For example, a given rising edge or a given falling edge may define or mark a boundary when one portion ends and a next portion, either of the same cycle or of a next cycle, begins.

In addition, a clock signal may include clock pulses that are formed or defined by the rising and falling edges of the clock signal. In particular example configurations, the clock pulses of a clock signal correspond to the high level of the clock signal, in that each clock pulse is defined by a rising edge followed by a period where the clock signal is at its high level, and then followed by a falling edge. A pulse width of a given clock pulse is a time duration extending from a time that the magnitude of the rising edge of the clock pulse is at or rises to a predetermined level (e.g., 50% of the high level) to a time that the magnitude of the falling edge of the clock pulse is at or falls to the predetermined level. The clock pulses of the clock signal may occur according to the frequency of the clock signal.

Additionally, a data signal is a signal that carries and/or includes data. The data carried by and/or included in a data signal includes a bit sequence of bits, where each bit includes or has a single-bit logic value of "1" or "0". The data signal may include a series or sequence of data pulses corresponding to a bit sequence of the data. Each data pulse may be at a level that indicates a data value, otherwise referred to as a logic level or a logic value. In addition, each data value is represented by a binary number or a binary value that includes one or more digits corresponding to and/or representing the one or more bits of the bit sequence. A duration of a data pulse is an amount of time that the level of the data pulse indicates the data value that the data pulse represents.

FIG. 5 shows a timing diagram of magnitude waveform of a portion of an example ith data signal DQ(i) representative of one of the input data signals DQ(1) to DQ(N). For purposes of illustration, the ith data signal DQ(i) shown in FIG. 5 includes seven data pulses. Each data pulse is shown as being either at a high level at or above a minimum high level $V_{H\_MIN}$ or at a low level at or below a maximum low level $V_{L\_MAX}$. For the example data signal DQ(i) in FIG. 2A, the high level and the low level each indicate a single-bit logic value of "1" or "0", where the high level corresponds to and/or indicates a single-bit logic value of "1" (otherwise referred to as a logic 1 value) and the low level corresponds to and/or indicates a single-bit logic value of "0" (otherwise referred to as a logic 0 value). Other example data signals where different levels of the magnitude waveform correspond to and/or indicate multi-bit logic values (i.e., logic values that each include two or more digits or bits) may be possible.

For two consecutive data pulses of the ith data signal DQ(i), where the two consecutive pulses correspond to different logic levels, the data signal DQ(i) performs a rising transition or a falling transition to transition between the two consecutive data pulses. For the example shown in FIG. 5, where one pulse in the sequence indicates a logic 0 value and a next pulse in the sequence indicates a logic 1 value, the ith data signal DQ(i) performs a rising transition to transition between the first and second pulses. On the other hand, where one pulse corresponds to a logic 1 value and a next pulse indicates a logic 0 value, the ith data signal DQ(i) performs a falling transition to transition between the first and second pulses. In addition, where two consecutive pulses indicate the same logic level, then as the pulse sequence transitions from the first data pulse to the next data pulse, the level of the ith data signal DQ(i) stays the same during those two pulses, and a rising transition or a falling transition may not occur. Regardless of whether a change in level of the ith data signal DQ(i) occurs when transitioning between two consecutive data pulses, the start of a given data pulse is referred to as a starting transition of the data pulse, and the end of a given data pulse is referred to as an ending transition of the data pulse.

In some embodiments, the receiving circuit 504 might possibly invert the data signal as the data signal is being processed. In one embodiment, the receiving circuit 504 inverts the data signal by passing the data signal through an odd number of inverters. Inverting the data signal causes the low voltage pulses of the data signal to be high voltage pulses, and causes the high voltage pulses of the data signal to be low voltage pulses. Also, inverting the data signal causes a "0" to be a "1", and likewise causes a "1" to be a "0".

Referring again to FIG. 4, the receiving circuit 404 may include sampling circuitry that performs sampling actions to identify data values of data carried by the input data signals DQ. As used herein, a sampling action is an action performed to determine, identify, detect, capture, obtain, or latch onto, a level or magnitude of a signal at a given point in time. A circuit that performs sampling actions is referred to as a sampling circuit, and the signal on which the sampling circuit performs a sampling action is referred to as an input signal of the sampling circuit. A sampling circuit performing a sampling action on an input signal may include an input terminal configured to receive the input signal. In addition, a sampling circuit performing a sampling action may output or present the level of the input signal that it identifies. The sampling circuit may do so by generating an output signal at an output terminal of the sampling circuit at a level that indicates or corresponds to the level of the input signal that the sampling circuit identifies at its input terminal. Accordingly, a sampling circuit samples an input signal, samples a level of the input signal, or performs a sampling action on an input signal by identifying a level of an input signal and outputting an output signal at a level indicating the level of the input signal that it identifies.

In particular example configurations, the sampling circuit generates its output signal at a level that matches, directly corresponds to, or is equal in value to the level of the input signal that it identifies. For example, if the sampling circuit identifies its input signal at a low level, then the sampling circuit performs a sampling action by generating its output signal at its output terminal at a low level, and if the sampling circuit identifies its input signal at a high level, then the sampling circuit performs a sampling action by generating its output signal at its output terminal at a high level.

In addition, a sampling circuit performs sampling actions in response to detecting a transition in a clock. The clock transition may be a rising transition or a falling transition, although in some embodiments, sampling transitions may include both rising transitions and falling transitions. Each time a sampling circuit detects a clock transition, the sampling circuit samples the input signal. The input signal that a sampling circuit samples is referred to as its input data signal, and the output signal that a sampling circuit generates and outputs in response to performing sampling actions on the input signal is referred to as its output data signal.

The sampling circuitry of the receiver circuit 404 may include a separate sampling circuit for each input data signal D1(1) to DQ(N). Each of the sampling circuits is configured to sample the levels of a respective one of the data signals DQ(1) to DQ(N). An example sampling circuit is a flip flop, such a D flip flop for example.

FIG. 6 is a block diagram of an example sampling circuit 600, such as a flip flop or a latch. The sampling circuit 600 includes a data input terminal or node D, a data output terminal or node Q and a clock input terminal or node C. The data input terminal D is configured to receive an input data signal DIN of which the sampling circuit 600 is configured to sample. The clock input terminal C is configured to receive a clock signal CLK of which the sampling circuit 600 is configured to detect sampling transitions. The data output terminal Q is configured to output an output data signal DOUT at levels and at times based on the levels of the input data signal DIN and the sampling transitions of the clock signal CLK. In particular, the sampling circuit 600 is configured to detect when each of the sampling transitions of the clock signal CLK occur. When the sampling circuit 600 detects that a sampling transition occurs, the sampling circuit 600 samples the level of the input data signal DIN at the data input terminal D, and generates the output data signal DOUT at the level of the input data signal DIN that the sampling circuit 600 identified. The sampling circuit 600 maintains or holds the output data signal DOUT at the data output terminal Q at the level it identified until it detects the next sampling transition of the clock signal CLK. Upon detecting the next sampling transition of the clock signal CLK, the sampling circuit 600 will again identify the level of the input data signal DIN at the data input terminal D, and generate the output data signal DOUT at the level of the input data signal DIN that the sampling circuit 600 identified in response to the next sampling transition. The sampling circuit 600 may continue to operate in this manner as it continues to receive additional data pulses of the input data signal DIN and detect sampling transitions of the clock signal CLK.

FIG. 7 is a schematic diagram illustrating setup time and hold time requirements of the sampling circuit 600. A sampling transition of the clock signal CLK is shown as occurring at a clock event time tce. An occurrence of a sampling transition of the clock signal CLK may be referred to as a clock event. When the sampling circuit 600 detects a sampling transition, it detects a clock event. A time duration from a first time t1 to the clock event time tce denotes the setup time tDS, and a time duration from the clock event time tce to a second time denotes the hold time tDH. In order to meet the setup and hold requirements of the sampling circuit 300, the level of a data pulse of the input data signal DIN should be stable from the first time t1 to the second time t2. A setup violation occurs when the level of input data signal DIN is unstable (it is still changing) after the first time t1 occurs. In other words, a setup violation occurs when the actual amount of time that the level of the input data signal DIN is stable before occurrence of the sampling transition at the clock event time tce is less than the amount of the setup time tDS. In addition, a hold violation occurs when the level of the input data signal DIN is unstable (it changes) before the second time t2. In other words, a hold violation occurs when the actual amount of time that the level of the input data signal DIN is stable after occurrence of the sampling transition at the clock event time tce is less than the amount of the hold time tDH.

For a data pulse of the input data signal DIN that the sampling circuit 600 is to sample, at least a portion of the duration that a level of the data pulse is stable—e.g., at least a portion of the duration that the data pulse is at the high level or at the low level—defines a data valid window TDvw. A data valid window TDvw is a time period or duration over which a given data pulse occurs during which a sampling circuit is to detect a sampling transition of the clock signal in order to avoid a setup violation and a hold violation. If the sampling transition occurs before the start of the data valid window TDvw, then a setup violation occurs—either because the sampling transition occurred before the starting transition of the data pulse, or because the sampling transition occurred too close to after the starting transition that the actual amount of time that the level of the data pulse is stable before occurrence of the sampling transition is less than the setup time tDS. In addition, if the sampling transition occurs after the end of the data valid window TDvw, then a hold violation occurs—either because the sampling transition occurred after the ending transition of the data pulse or occurred too close to before the ending transition that the actual amount of time that the level of the data pulse is stable after occurrence of the sampling transition is less than the hold time tDH.

Ideally, the sampling circuit 600 receives the clock signal CLK and the input data signal DIN relative to each other such that the sampling circuit 600 reliably or accurately samples the level of each data pulse in order to correctly identify the data value that each data pulse represents. Configuring the sampling circuit 600 to sample each data pulse in the middle or at a middle point of the duration of each pulse may maximize the chances of this ideal situation occurring. The ideal time at which to sample a data pulse is referred to as a target sampling time of the data pulse. Ideally, the sampling circuit 600 identifies sampling transitions in the middle of the durations of the data pulses and/or at the target sampling times of the data pulses.

Accordingly, a given sampling transition is in a target sampling position when the sampling transition occurs at the target sampling time of its associated data pulse.

FIG. 8 shows a data pulse of the input data signal DIN and a pulse of the clock signal CLK, illustrating the ideal case where a sampling transition of the clock pulse is in the target sampling position. In FIG. 8, a starting transition of the data pulse occurs at a first time t1, and an ending transition of the data pulse occurs at a second time t2. A target sampling time tt of the data pulse occurs in the middle between the first time t1 and the second time t2. Accordingly, a first time period T1 extending from the first time t1 to the target sampling time tt is the same as or equal to a second time period T2 extending from the target sampling time tt to the second time t2. Additionally, the sampling transition associated with the data pulse is the rising transition of the clock pulse. The sampling transition occurs at a sampling time ts. In FIG. 5, for the ideal case, the sampling transition occurs at the target sampling time—i.e., the sampling time ts and the target sampling time tt are the same.

Figure 9A:
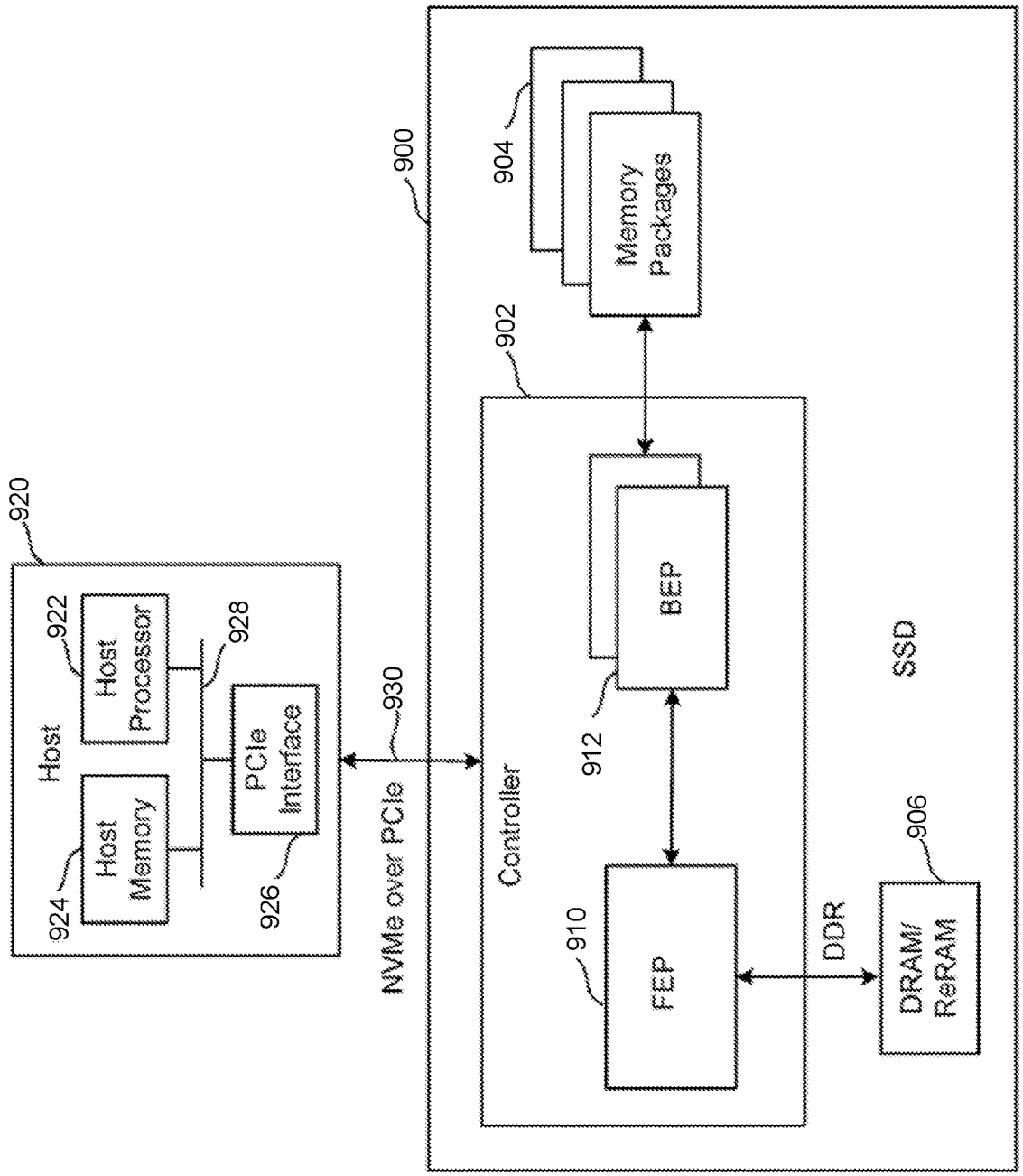
FIG. 9A is a block diagram of one embodiment of a storage device connected to a host.

FIGS. 9A, 9B, 10, 11, and 12 depict an example memory system in which various embodiments of the present disclosure. FIG. 9A is a block diagram of one embodiment of a storage device 900 connected to a host 920. Storage device 900 can implement the technology proposed herein. Many different types of storage devices can be used with the technology proposed herein. One example storage device is a solid state device (SSD); however, other types of storage devices can also be used. Storage device 900 comprises a Controller 902, non-volatile memory 904 for storing data, and local memory (e.g. DRAM/ReRAM) 906. Controller 902 comprises a Front End Processor Circuit (FEP) 910 and one or more Back End Processor Circuits (BEP) 912. In one embodiment, FEP 910 circuit is implemented on an ASIC. In one embodiment, each BEP circuit 912 is implemented on a separate ASIC. The ASICs for each of the BEP circuits 912 and the FEP circuit 910 are implemented on the same semiconductor such that the Controller 902 is manufactured as a System on a Chip (SoC). FEP 910 and BEP 912 both include their own processors. In one embodiment, FEP 910 and BEP 912 work as a master slave configuration where the FEP 910 is the master and each BEP 912 is a slave. For example, FEP circuit 910 implements a flash translation layer that performs memory management (e.g., garbage collection, wear leveling, etc.), logical to physical address translation, communication with the host, management of DRAM (local volatile memory) and management of the overall operation of the SSD (or other non-volatile storage device). The BEP circuit 912 manages memory operations in the memory packages/die at the request of FEP circuit 110. For example, the BEP circuit 912 can carry out the read, erase, and programming processes. Additionally, the BEP circuit 912 can perform buffer management, set specific voltage levels required by the FEP circuit 910, perform error correction, control the Toggle Mode interfaces to the memory packages, etc. In one embodiment, each BEP circuit 912 is responsible for its own set of memory packages. Controller 902 is one example of a control circuit In one embodiment, non-volatile memory 904 comprises a plurality of memory packages. Each memory package includes one or more memory die. Therefore, Controller 902 is connected to one or more non-volatile memory die. In one embodiment, each memory die in the memory packages 904 utilize NAND flash memory (including two dimensional NAND flash memory and/or three dimensional NAND flash memory). In other embodiments, the memory package can include other types of memory.

Controller 902 communicates with host 920 via an interface 930 that implements NVM Express (NVMe) over PCI Express (PCIe). For working with storage device 900, host 920 includes a host processor 922, host memory 924, and a PCIe interface 926 connected to bus 928. Host memory 924 is the host's physical memory, and can be DRAM, SRAM, non-volatile memory, or another type of storage. Host 920 is external to and separate from storage device 900. In one embodiment, storage device 900 is embedded in host 920. Any combination of one or more of storage device 900, controller 902, FEP 910, BEP 912, and/or memory packages 904 may be referred to herein as an apparatus. In operation, when the host 920 needs to read data from or write data to the non-volatile memory 904, it will communicate with the controller 902. If the host 920 provides a logical address to which data is to be read/written, the controller can convert the logical address received from the host to a physical address in the non-volatile memory 904.

Figure 9B:
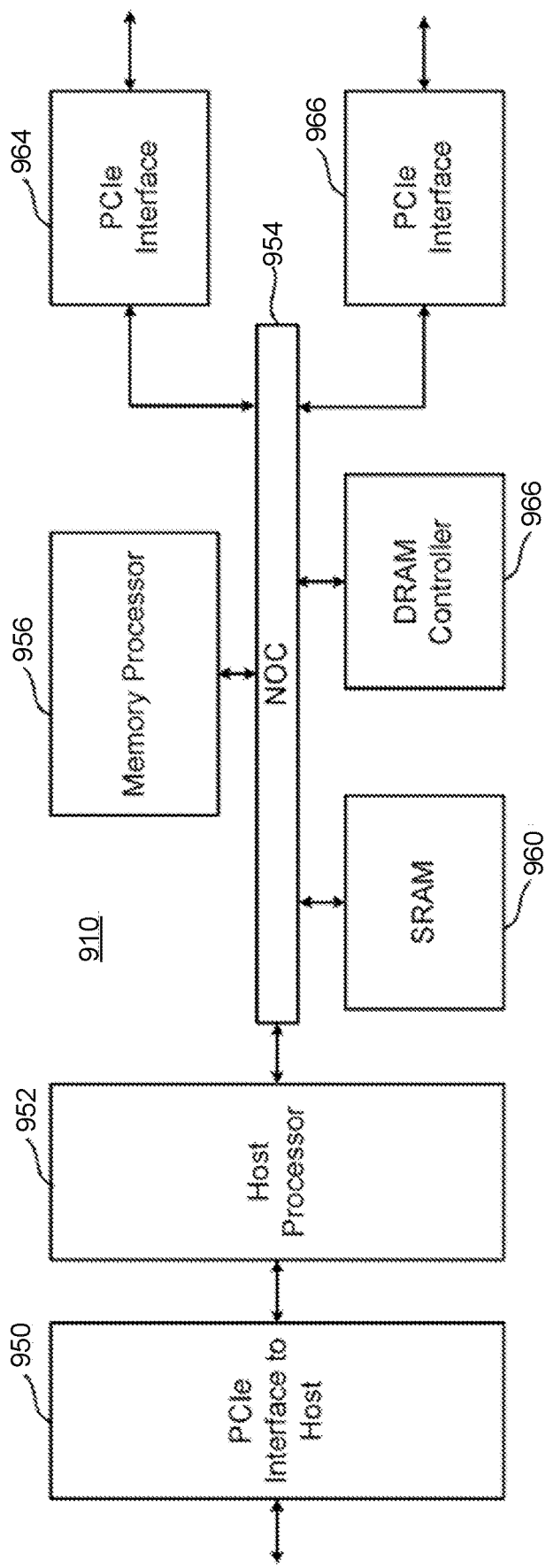
FIG. 9B is a block diagram of one embodiment of a Front End Processor Circuit. In some embodiments, the Front End Processor Circuit is part of a Controller.
Figure 10:
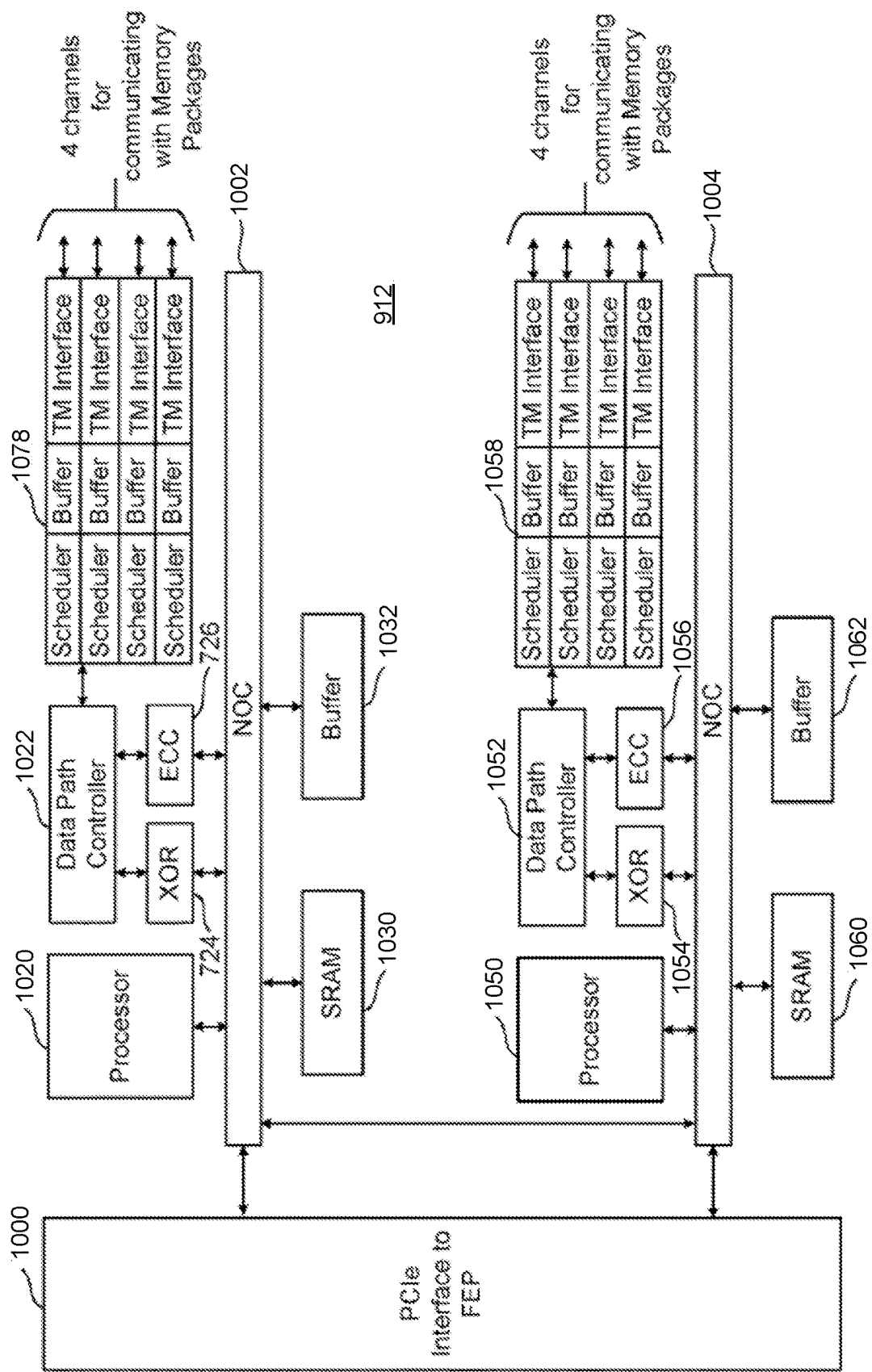
FIG. 10 is a block diagram of one embodiment of a Back End Processor Circuit. In some embodiments, the Back End Processor Circuit is part of a Controller.

FIG. 9B is a block diagram of one embodiment of FEP circuit 910. FIG. 9B shows a PCIe interface 950 to communicate with host 920 and a host processor 952 in communication with that PCIe interface. The host processor 952 can be any type of processor known in the art that is suitable for the implementation. Host processor 952 is in communication with a network-on-chip (NOC) 954. A NOC is a communication subsystem on an integrated circuit, typically between cores in a SoC. NOC's can span synchronous and asynchronous clock domains or use unclocked asynchronous logic. NOC technology applies networking theory and methods to on-chip communications and brings notable improvements over conventional bus and crossbar interconnections. NOC improves the scalability of SoCs and the power efficiency of complex SoCs compared to other designs. The wires and the links of the NOC are shared by many signals. A high level of parallelism is achieved because all links in the NOC can operate simultaneously on different data packets. Therefore, as the complexity of integrated subsystems keep growing, a NOC provides enhanced performance (such as throughput) and scalability in comparison with previous communication architectures (e.g., dedicated point-to-point signal wires, shared buses, or segmented buses with bridges). Connected to and in communication with NOC 954 is the memory processor 956, SRAM 960 and a DRAM controller 962. The DRAM controller 962 is used to operate and communicate with the DRAM (e.g., DRAM 906). SRAM 960 is local RAM memory used by memory processor 956. Memory processor 956 is used to run the FEP circuit and perform the various memory operations. Also in communication with the NOC are two PCIe Interfaces 964 and 966. In the embodiment of FIG. 9B, the SSD controller will include two BEP circuits 912; therefore there are two PCIe Interfaces 964/666. Each PCIe Interface communicates with one of the BEP circuits 912. In other embodiments, there can be more or less than two BEP circuits 912; therefore, there can be more than two PCIe Interfaces.

FIG. 10A is a block diagram of one embodiment of the BEP circuit 912. FIG. 10A shows a PCIe Interface 1000 for communicating with the FEP circuit 910 (e.g., communicating with one of PCIe Interfaces 964 and 966 of FIG. 9B). PCIe Interface 1000 is in communication with two NOCs (Network-on-a-Chip) 1002 and 1004. In one embodiment, the two NOCs can be combined to one large NOC. Each NOC (1002 and 1004) is connected to SRAM (1030 and 1060), a buffer (1032 and 1062), processor (1020 and 1050), and a data path controller (1022 and 1052) via an XOR engine (1024 and 1054) and an ECC engine (1026 and 1056). The ECC engines 1026 and 1056 are used to perform error correction, as known in the art. The XOR engines 1024 and 1054 are used to XOR the data so that data can be combined and stored in a manner that can be recovered in case there is a UECC failure. In an embodiment, XOR engines 1024 and 1054 form a bitwise XOR of different pages of data. The XOR result may be stored in a memory package 904. In the event that an ECC engine 1026 and 1056 is unable to successfully correct all errors in a page of data that is read back from a memory package 904, the stored XOR result may be accessed from the memory package 904. The page of data may then be recovered based on the stored XOR result, along with the other pages of data that were used to form the XOR result.

Data path controller 1022 is connected to an interface module for communicating via four channels with memory packages. Thus, the top NOC 1002 is associated with an interface 1028 for four channels for communicating with memory packages and the bottom NOC 1004 is associated with an interface 1058 for four additional channels for communicating with memory packages. Each interface 1028 and 1058 includes four Toggle Mode interfaces (TM Interface), four buffers and four schedulers. There is one scheduler, buffer, and TM Interface for each of the channels. The processor can be any standard processor known in the art. The data path controllers 1022 and 1052 can be a processor, FPGA, microprocessor, or other type of controller. The XOR engines 1024 and 1054 and ECC engines 1026 and 1056 are dedicated hardware circuits, known as hardware accelerators. In other embodiments, the XOR engines 1024 and 1054 and ECC engines 1026 and 1056 can be implemented in software. The scheduler, buffer, and TM Interfaces are hardware circuits.

Interfaces 1028 and 1058, alone or in combination, may be referred to as a memory interface configured to be connected to non-volatile memory (e.g., memory package 904). A combination of one or more of processor 1020 and 1050, data path controller 1022 and 1052, XOR 1024 and 1054, ECC 1026 and 1056 may be referred to herein as a processor circuit. The buffer 1032 and 1062, SRAM 1030 and 1060, and/or NOCs 1002 and 1004 may also be considered to be a part of the processor circuit.

Figure 11:
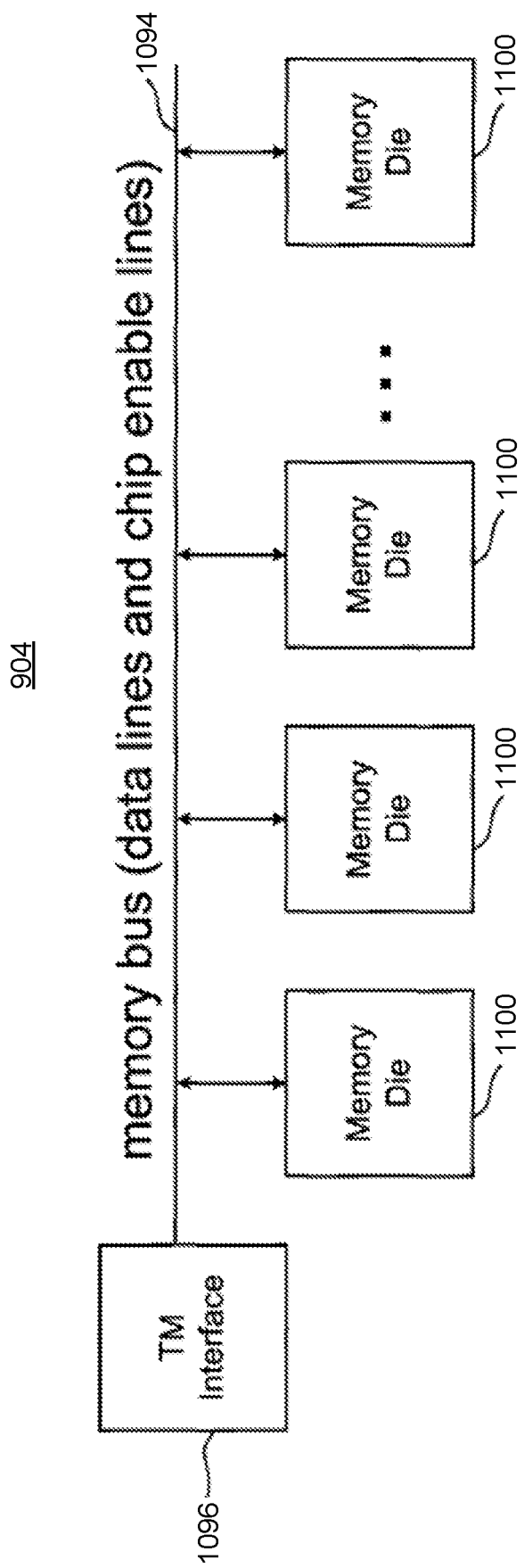
FIG. 11 is a block diagram of one embodiment of a memory package.
Figure 12:
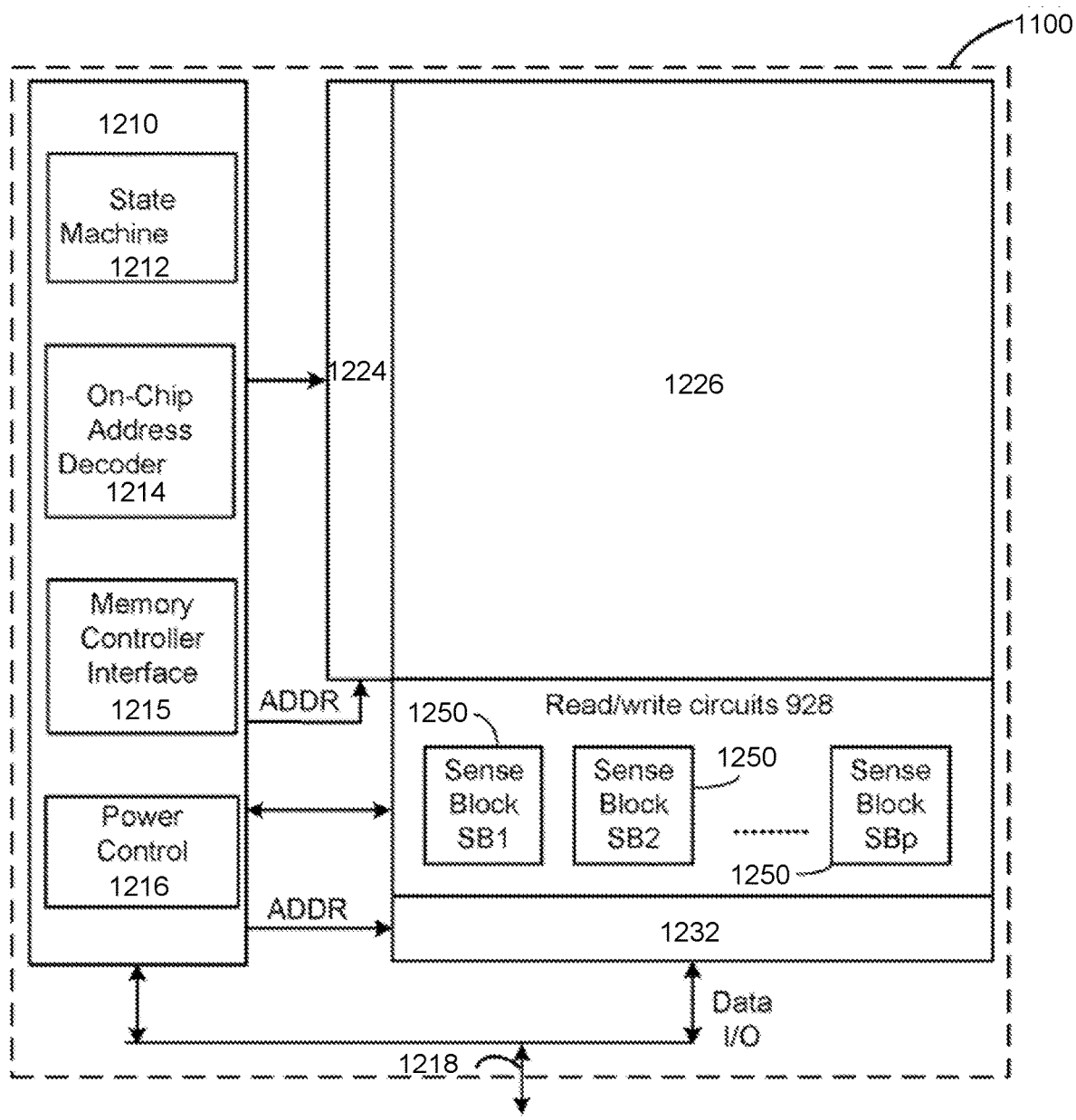
FIG. 12 is a block diagram of one embodiment of a memory die.
Figure 13:
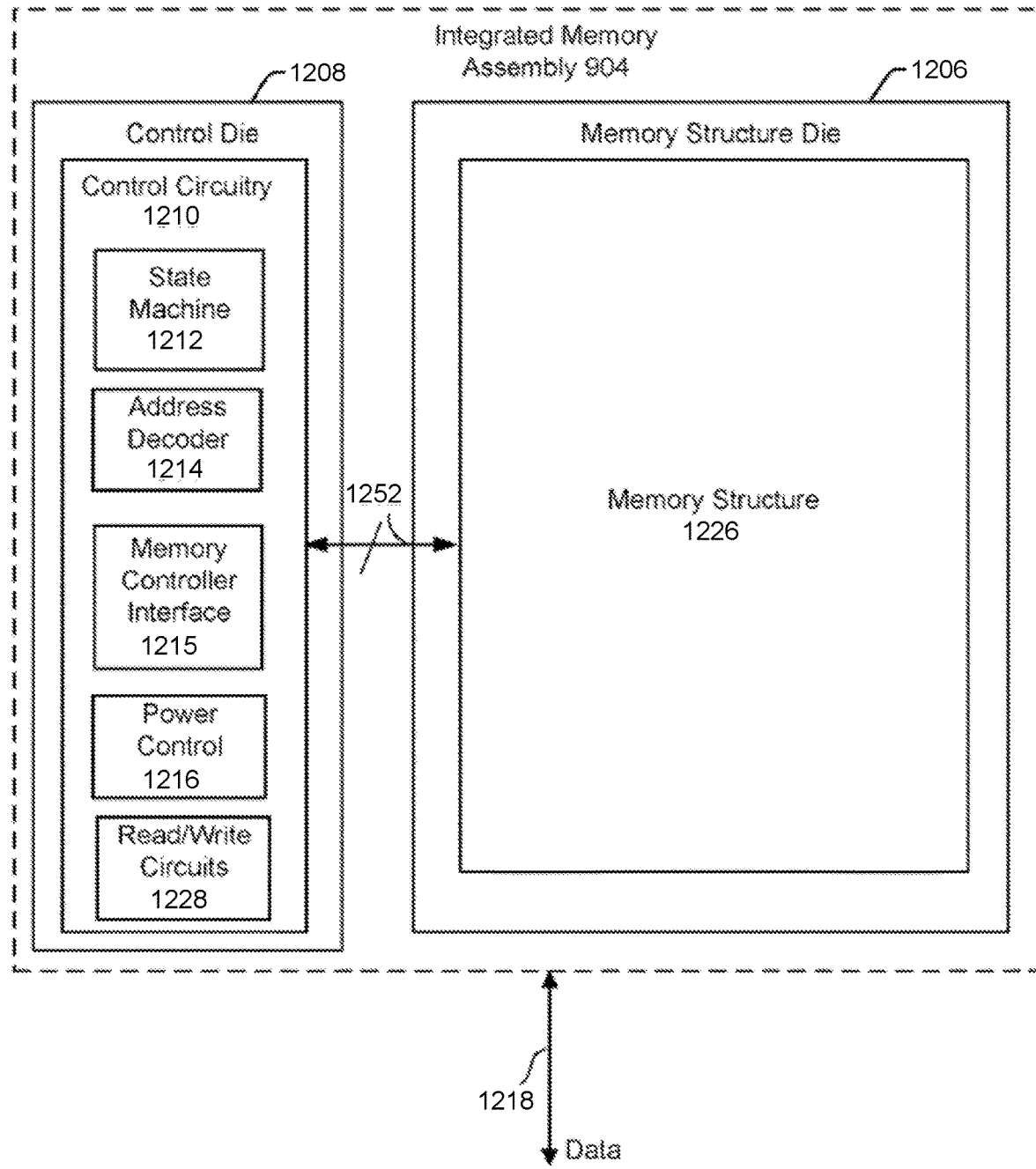
FIG. 13 is a block diagram of one embodiment of an integrated memory assembly.

FIG. 11 is a block diagram of one embodiment of a memory package 904 that includes a plurality of memory die 1100 connected to a memory bus (data lines and chip enable lines) 1094. The memory bus 1094 connects to a Toggle Mode Interface 1096 for communicating with the TM Interface of a BEP circuit 912 (see e.g., FIG. 10). In some embodiments, the memory package can include a small controller connected to the memory bus and the TM Interface. The memory package can have one or more memory die. In one embodiment, each memory package includes eight or 96 memory die; however, other numbers of memory die can also be implemented. The technology described herein is not limited to any particular number of memory die.

FIG. 12A is a functional block diagram of one embodiment of a memory die 1100. Each of the one or more memory die 1100 of FIG. 11 can be implemented as memory die 1100 of FIG. 12A. The components depicted in FIG. 12A are electrical circuits. In one embodiment, each memory die 1100 includes a memory structure 1226, control circuitry 1210, and read/write circuits 1228, all of which are electrical circuits. Memory structure 1226 is addressable by word lines via a row decoder 1224 and by bit lines via a column decoder 1232. The read/write circuits 1228 include multiple sense blocks 1250 including SB1, SB2, . . . , SBp (sensing circuitry) and allow a page (or multiple pages) of data in multiple memory cells to be read or programmed in parallel. In one embodiment, each sense block includes a sense amplifier and a set of latches connected to the bit line. The latches store data to be written and/or data that has been read. The sense blocks include bit line drivers.

Commands and data are transferred between the controller 902 and the memory die 1100 via memory controller interface 1215. Examples of memory controller interface 1215 include a Toggle Mode Interface and an Open NAND Flash Interface (ONFI). Other I/O interfaces can also be used.

Control circuitry 1210 cooperates with the read/write circuits 1228 to perform memory operations (e.g., write, read, erase, and others) on memory structure 1226. In one embodiment, control circuitry 1210 includes a state machine 1212, an on-chip address decoder 1214, a power control module 1216, and a memory controller interface 1215. State machine 1212 provides die-level control of memory operations. In one embodiment, state machine 1212 is programmable by software. In other embodiments, state machine 1212 does not use software and is completely implemented in hardware (e.g., electrical circuits). In some embodiments, state machine 1212 can be replaced by a microcontroller or microprocessor. In one embodiment, control circuitry 1210 includes buffers such as registers, ROM fuses and other storage devices for storing default values such as base voltages and other parameters. The default values and other parameters could be stored in a region of the memory structure 1226.

The on-chip address decoder 1214 provides an address interface between addresses used by controller 902 to the hardware address used by the decoders 1224 and 1232. Power control module 1216 controls the power and voltages supplied to the word lines and bit lines during memory operations. Power control module 1216 may include charge pumps for creating voltages.

Memory controller interface 1215 is an electrical interface for communicating with memory controller 902. For example, memory controller interface 1215 may implement a Toggle Mode Interface that connects to the Toggle Mode interfaces of memory interface 228/258 for memory controller 902. In one embodiment, memory controller interface 1215 includes a set of input and/or output (I/O) pins that connect to communication channel 1218 (also refers to herein as a data bus). In one embodiment, communication channel 1218 connects to the memory controller 902 as part of the Toggle Mode Interface.

For purposes of this document, control circuitry 1210, alone or in combination with read/write circuits 1228 and decoders 1224/1232, comprise one or more control circuits connected to memory structure 1226. This one or more control circuits are an electrical circuit that performs the functions described below in the flow charts. In other embodiments, the one or more control circuits can consist only of controller 902 (or other controller), which is an electrical circuit in combination with software (e.g., firmware), that performs the functions described below in the flow charts. In one embodiment, the one or more control circuits is the controller where the controller is an electrical circuit that does not use hardware. In another alternative, the one or more control circuits comprises controller 902 and control circuitry 1210 performing the functions described below in the flow charts. In another embodiment, the one or more control circuits comprises state machine 1212 (and/or a microcontroller and/or microprocessor) alone or in combination with controller 902. In another alternative, the one or more control circuits comprises controller 902, control circuitry 1210, read/write circuits 1228 and decoders 1224/1232 performing the functions described below in the flow charts. In other embodiments, the one or more control circuits comprises one or more electrical circuits that operate the non-volatile memory. The term apparatus as used herein may include, but is not limited to, memory die 1100, non-volatile memory 904, storage device 900, or a host system 920 that includes a storage device 900.

In one embodiment, memory structure 1226 comprises a monolithic three-dimensional memory array of non-volatile memory cells in which multiple memory levels are formed above a single substrate, such as a wafer. The memory structure may comprise any type of non-volatile memory that is monolithically formed in one or more physical levels of arrays of memory cells having an active area disposed above a silicon (or other type of) substrate. In one example, the non-volatile memory cells of memory structure 1226 comprise vertical NAND strings with charge-trapping material such as described, for example, in U.S. Pat. No. 9,721,662, incorporated herein by reference in its entirety. In another embodiment, memory structure 1226 comprises a two dimensional memory array of non-volatile memory cells. In one example, the non-volatile memory cells are NAND flash memory cells utilizing floating gates such as described, for example, in U.S. Pat. No. 9,082,502, incorporated herein by reference in its entirety. Other types of memory cells (e.g., NOR-type flash memory) can also be used.

The exact type of memory array architecture or memory cell included in memory structure 1226 is not limited to the examples above. Many different types of memory array architectures or memory cell technologies can be used to form memory structure 1226. No particular non-volatile memory technology is required for purposes of the new claimed embodiments proposed herein. Other examples of suitable technologies for memory cells of the memory structure 1226 include ReRAM memories, magnetoresistive memory (e.g., MRAM, Spin Transfer Torque MRAM, Spin Orbit Torque MRAM), phase change memory (e.g., PCM), and the like. Examples of suitable technologies for architectures of memory structure 1226 include two dimensional arrays, three dimensional arrays, cross-point arrays, stacked two dimensional arrays, vertical bit line arrays, and the like.

One example of a ReRAM, or PCMRAM, cross point memory includes reversible resistance-switching elements arranged in cross point arrays accessed by X lines and Y lines (e.g., word lines and bit lines). In another embodiment, the memory cells may include conductive bridge memory elements. A conductive bridge memory element may also be referred to as a programmable metallization cell. A conductive bridge memory element may be used as a state change element based on the physical relocation of ions within a solid electrolyte. In some cases, a conductive bridge memory element may include two solid metal electrodes, one relatively inert (e.g., tungsten) and the other electrochemically active (e.g., silver or copper), with a thin film of the solid electrolyte between the two electrodes. As temperature increases, the mobility of the ions also increases causing the programming threshold for the conductive bridge memory cell to decrease. Thus, the conductive bridge memory element may have a wide range of programming thresholds over temperature.

Magnetoresistive memory (MRAM) stores data by magnetic storage elements. The elements are formed from two ferromagnetic plates, each of which can hold a magnetization, separated by a thin insulating layer. One of the two plates is a permanent magnet set to a particular polarity; the other plate's magnetization can be changed to match that of an external field to store memory. A storage device is built from a grid of such memory cells. In one embodiment for programming, each memory cell lies between a pair of write lines arranged at right angles to each other, parallel to the cell, one above and one below the cell. When current is passed through them, an induced magnetic field is created.

Phase change memory (PCM) exploits the unique behavior of chalcogenide glass. One embodiment uses a Ge.sub.2Sb.sub.2Te.sub.5 alloy to achieve phase changes by electrically heating the phase change material. The doses of programming are electrical pulses of different amplitude and/or length resulting in different resistance values of the phase change material.

A person of ordinary skill in the art will recognize that the technology described herein is not limited to a single specific memory structure, but covers many relevant memory structures within the spirit and scope of the technology as described herein and as understood by one of ordinary skill in the art.

FIG. 12B depicts a functional block diagram of one embodiment of an integrated memory assembly 1204. The integrated memory assembly 1204 may be used in a memory package 904 in memory system 900. In one embodiment, the integrated memory assembly 1204 includes two types of semiconductor die (or more succinctly, "die"). Memory structure die 1206 includes include memory structure 1226. Memory structure 1226 may contain non-volatile memory cells. Control die 1208 includes control circuitry 1210. In some embodiments, the memory structure die 1206 and the control die 1208 are bonded together. The control circuitry includes state machine 1212, an address decoder 1214, a power control circuit 1216, and memory controller interface 1215. The control circuitry also includes read/write circuits 1228. In another embodiment, a portion of the read/write circuits 1228 are located on control die 1208, and a portion of the read/write circuits 1228 are located on memory die 1206.

Any subset of components in the control circuitry 1210 can be considered one or more control circuits. The one or more control circuits can include hardware only or a combination of hardware and software (including firmware). For example, a controller programmed by firmware is one example of a control circuit. One or more control circuits can include a processor, PGA (Programmable Gate Array, FPGA (Field Programmable Gate Array), ASIC (Application Specific Integrated Circuit), integrated circuit or other type of circuit.

Pathways 1252 are pathways between one or more components in the control circuitry 1210 and the memory structure on memory structure die 1206. A pathway may be used to provide or receive a signal (e.g., voltage, current). A pathway includes an electrically conductive path. A pathway may include one or more of, but is not limited to, a bond pad, metal interconnect, via, transistor, electrically conducting material and other material that may transfer or carry an electrical signal.

In one embodiment, integrated memory assembly 1204 includes a set of input and/or output (I/O) pins that connect to communication channel 1218 (also refers to herein as a data bus). Communication channel 1218 is depicted as being connected to integrated memory assembly 1204 for generality. Communication channel 1218 may connect to either or both of die 1206 and/or 1208. In one embodiment, communication channel 1218 connect the memory controller 902 directly to control die 1208.

Figure 14:
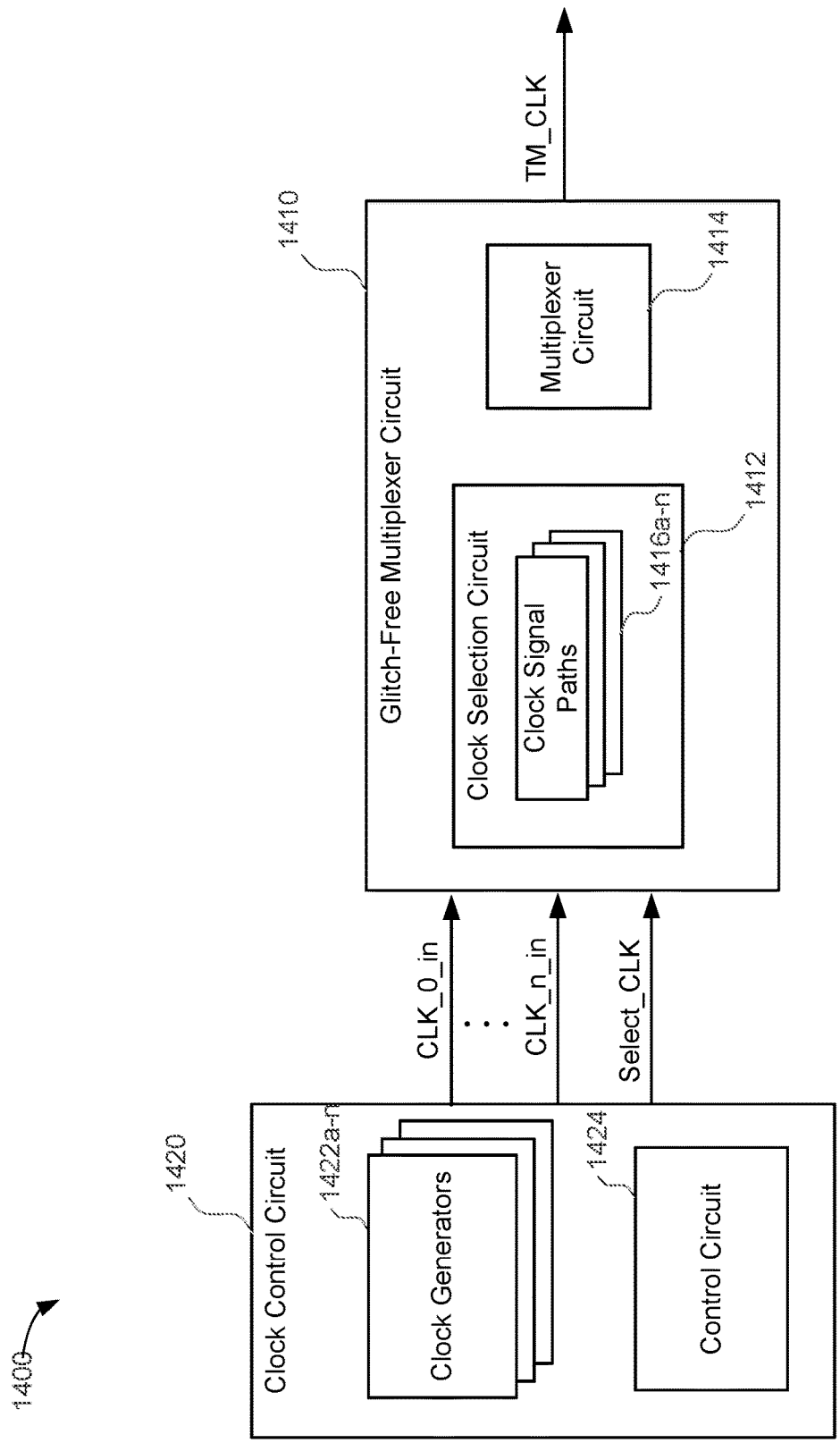
FIG. 14 is a block diagram of a system for glitch-free clock multiplexing according to example embodiments of the disclosed technology.

FIG. 14 is a block diagram of a system 1400 for glitch-free clock multiplexing according to example embodiments of the disclosed technology. System 1400 includes a glitch-free multiplexing circuit 1410 for selecting between a plurality of input clock signals, a first input clock signal CLK_0_in and an nth input clock signal CLK_n_in, where n is an integer representing a number of input clock signals. Glitch-free multiplexing circuit 1410 includes a clock selection circuit 1412 configured to select between the first clock to nth clock in response to a clock selection signal, Select_CLK. Glitch-free multiplexing circuit 1410 also includes a multiplexer circuit 1414 configured to provide an output clock signal TM_CLK based on the clock selected at the clock selection circuit 1412. In some embodiments, the input clock signals, CLK_0_in to CLK_n_in, can be asynchronous clocks, and the selection signal Select_CLK can be asynchronous to the input clock signals, CLK_0_in to CLK_n_in. In some embodiments, the clocks may be external clocks and/or internal clocks. Each input clock signal may have a different clock frequency, which may be used to clock IP blocks downstream from glitch-free multiplexer circuit 1410 according to the output clock signal TM_CLK.

The clock selection circuit 1412 is configured to perform clock selection from the plurality of input clock signals, CLK_0_in to CLK_n_in, without a reference clock input (e.g., REF_CLK of FIGS. 1A AND 1B). The clock selection circuit 1412 includes a plurality of clock path circuits 1416a-1416n (collectively referred to herein as "clock path circuits 1416"), which provide for operation without a reference clock. Each clock path circuit 1416a-1416n is configured to be activated or deactivated based on the selection signal Select_CLK. For example, the clock selection circuit 1412 is configured to keep all clock path circuits 1416 active after system startup or reset (e.g., turned off then back on). As used herein, startup refers to both a reset operation, an initial system startup, or any startup operation that activates the system 1400. Since all clock path circuits 1416 are active, a reference clock is not required to initialize the system. Thus, glitch-free multiplexer circuit 1410 is configured for clock interchangeability at any point in time. For example, without requiring a reference clock post startup, the clock selection circuit 1412 is able to initialize with any input clock signal, CLK_0_in to CLK_n_in. Thereby, decreasing startup time and switching times.

Furthermore, clock selection circuit 1412 operates according to the principle of deselecting active clock path circuits 1416 and enabling a clock path circuit 1416 of a selected clock. For example, as noted above, after a system startup, clock path circuits 1416 for all input clock signals are activated within the clock selection circuit 1412. Then, in response to receiving a selection signal, Select_CLK, in which selection bits are set as either logic high level (e.g., 1) or low level (e.g., 0) in accordance with a clock selection, the unselected input clock path circuits 1416 are deactivated. Based on deactivating the unselected clock path circuits 1416, the selected input clock path circuit 1416 is activated, as described in greater detail below in connection with FIGS. 15A through 15C. Thus, the clock path circuit 1416 of the selected input clock signal is enabled and the selected input clock signal propagates to the multiplexer circuit 1414. The multiplexer circuit 1414 converges the selected input clock signal into the clock output signal TM_CLK and outs the signal TM_CLK for utilization downstream.

By utilizing the above-described principles, system 1400 can be insensitive to noise and noisy environments and unaffected by delays in selection control. For example, activating all clock path circuits 1416 and deselecting unselected clock path circuits 1416 can permit resolution selection control to settle before enabling a clock switch decision to a selected clock path circuit 1416. For example, when selection control switches from the selection signal from 01→10 (e.g., bits of the Select_CLK signal are switched from 0 for a CLK_0_in and 1 for CLK_1_in to 1 for CLK_0_in to 0 for CLK_1_in), unselected clock path circuits may be turned off first in a number of clock cycles (also referred to as a clock period), then only the selected clock path circuit is activated. Any skew or noise which can corrupt selection control can resolves itself within the clock period, thus maintaining a consistent clock output, TM_CLK. Embodiments herein may wait at least two clock cycles (e.g., a clock period); however, the number of cycles may be increased as desired. For example, one way to increase clock cycles is to add more pipeline stages.

In some embodiments, system 1400 may include a clock control circuit 1420. In an embodiment, clock control circuit 1420 includes a plurality of clock generator circuits 1422a-1422n and a control circuit 1424. Each clock generator 1422a-n is configured to provide a corresponding clock via a corresponding clock input signal, for example, first clock generator 1422a provides a first clock via first clock input signal CLK_0_in, and the nth clock generator 1422n provides an nth clock via the nth clock input signal, CLK_n_in. Control circuit 1424 is configured to generate a clock selection signal, Select_CLK, and other control signals. In some embodiments, one of the clock generators may receive a clock from an external source. In some embodiments, clock control circuit 1420 can reside in an external circuit.

Figure 15A:
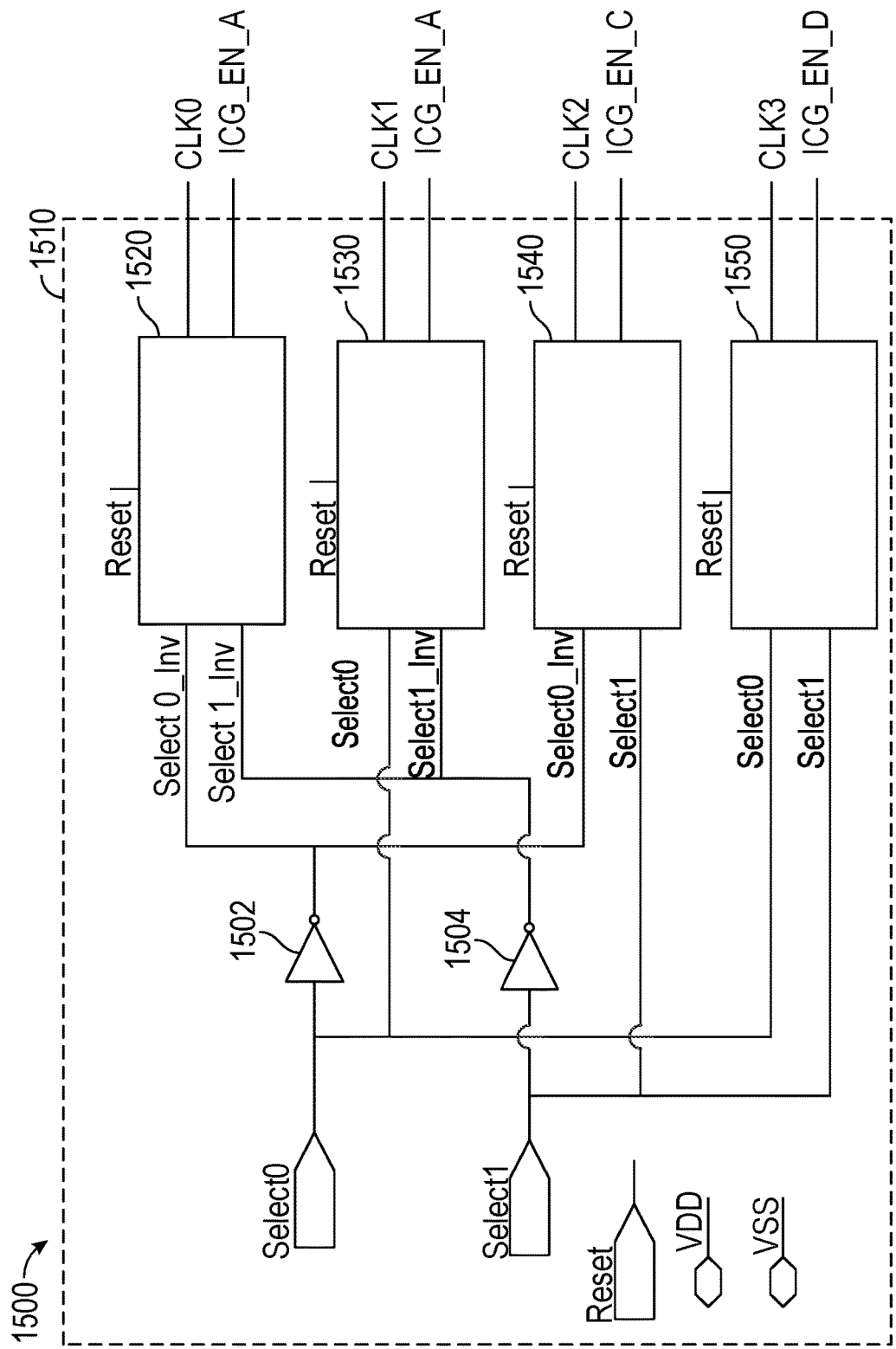
FIGS. 15A-15D depict an example circuit implementation of a glitch-free multiplexer according to example embodiments of the disclosed technology.
Figure 15B:
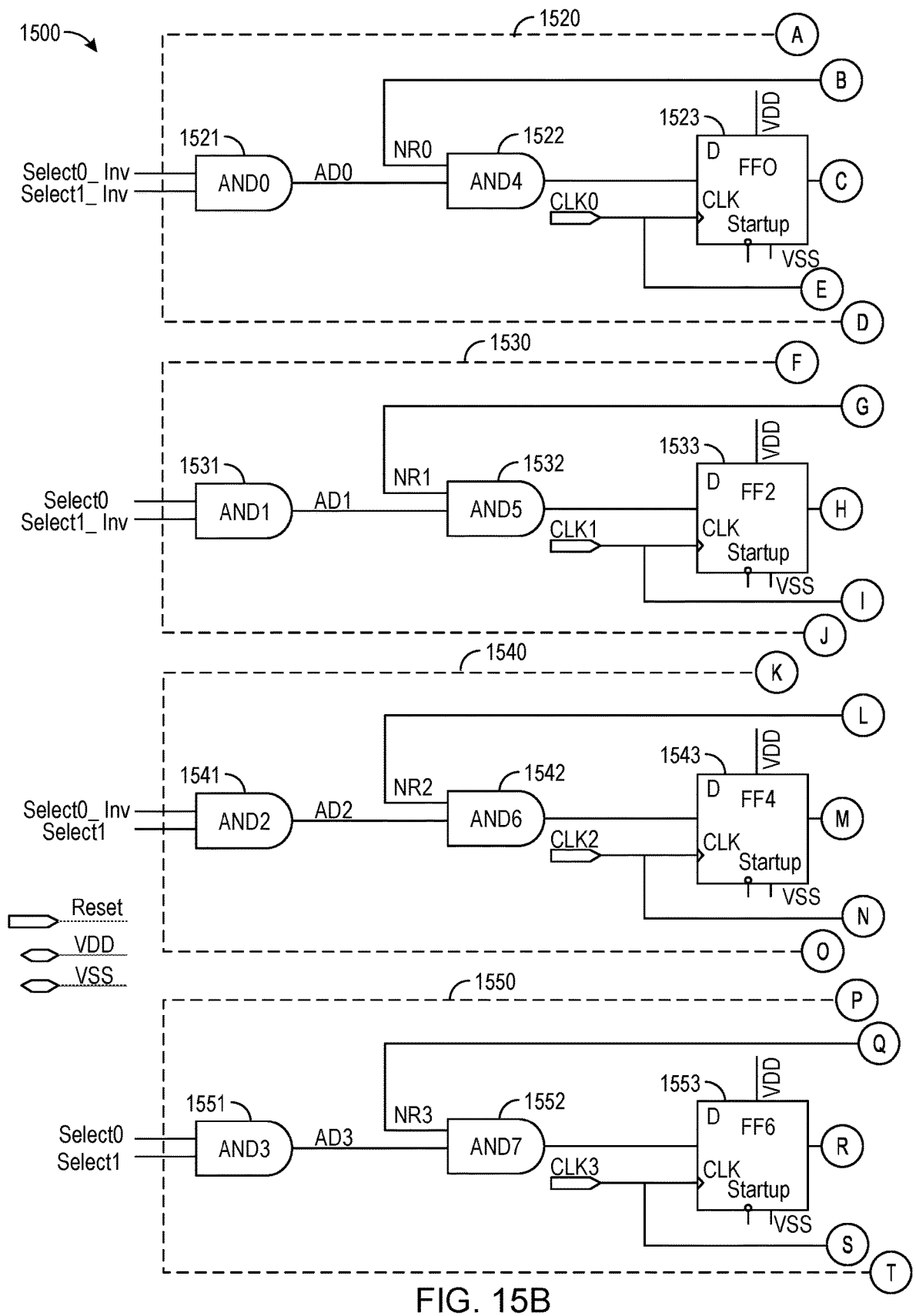
Figure 15C:
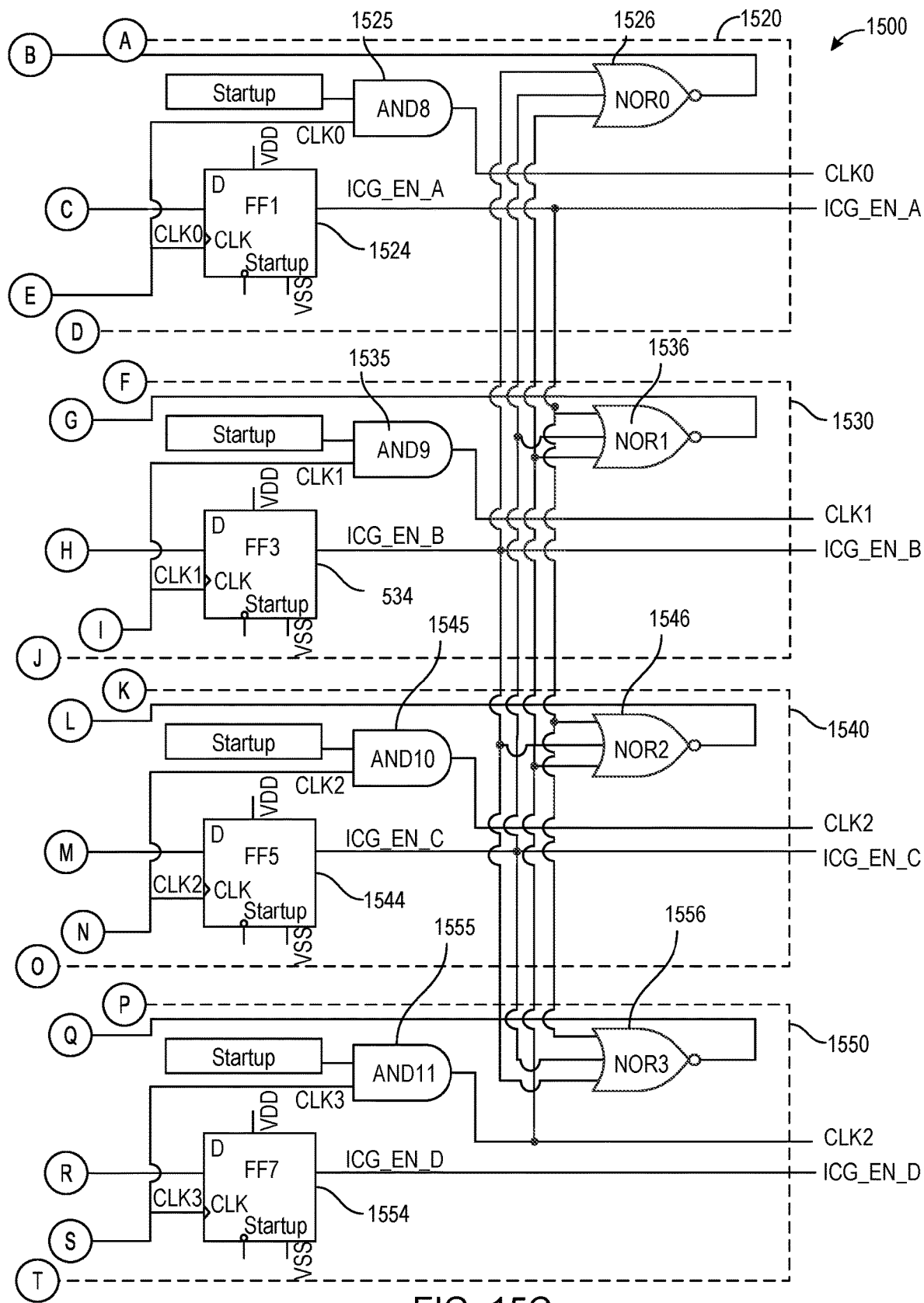
Figure 15D:
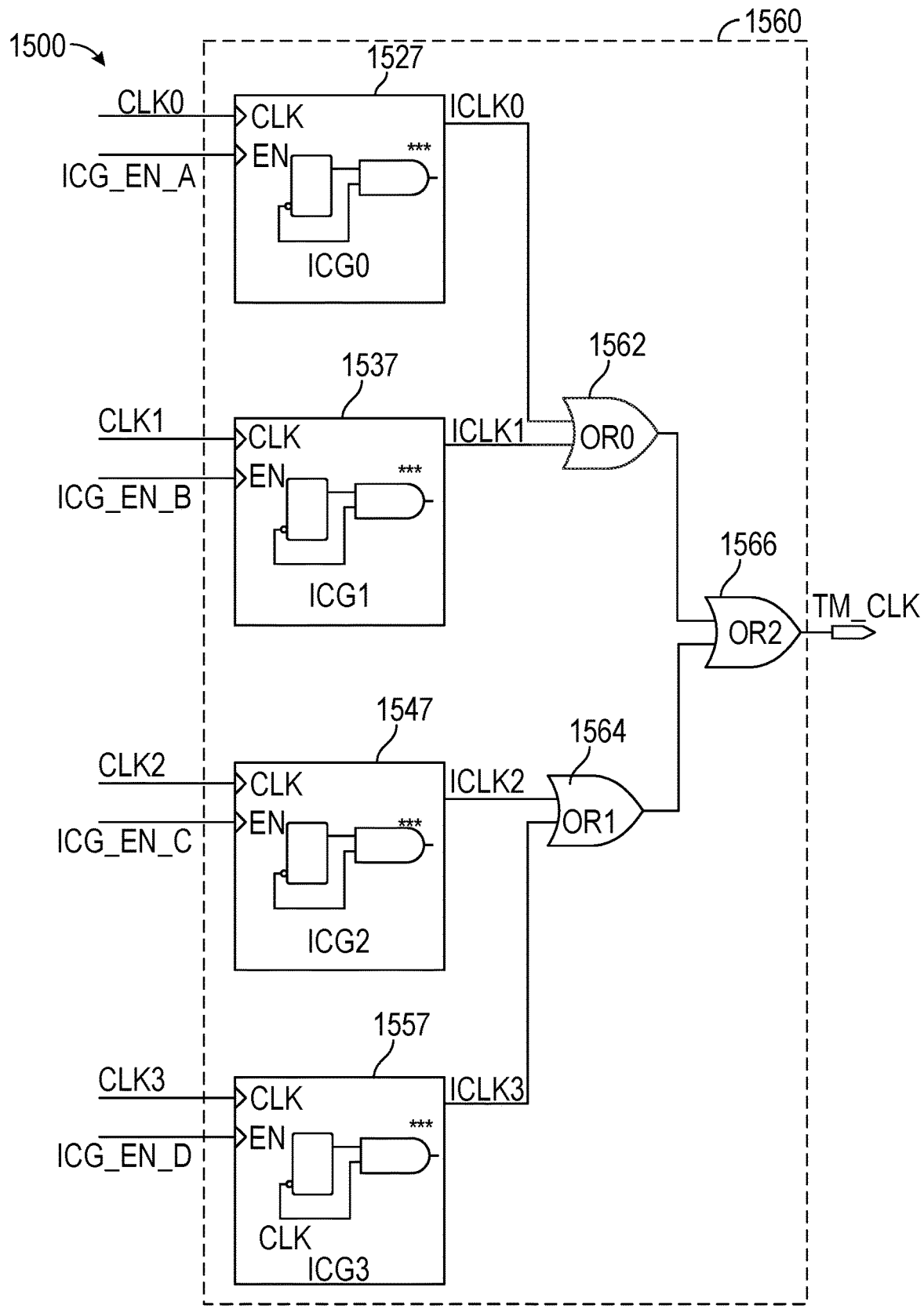

FIGS. 15A-15D depict a schematic diagram of an example circuit implementation 1500 of a glitch-free multiplexer according to example embodiments of the disclosed technology. The circuit 1500 includes a clock selection circuit and a multiplexer circuit. FIG. 15A depicts a diagram of an example circuit implementation 1510 of the clock selection circuit, which may be similar to the clock selection circuit 1412 of FIG. 14. FIGS. 15B and 15C depict a diagram of an example circuit implementation of the clock path circuits of the circuit 1510 which may be similar to the clock path circuits 1416 of FIG. 14. FIG. 15D depicts a diagram of an example circuit implementation 1560 of the multiplexer circuit, which may be similar to the multiplexer circuit 1414 of FIG. 14.

Referring first to FIG. 15A, a startup signal and a selection signal is input into the circuit 1510, which includes a first bit, Select0, and a second bit, Select1, set to either logic low level (e.g., 0) or logic high level (e.g., 1) according to a desired clock selection. For example, to select a first clock the first and second bits may both be set to 0, to select a second clock the first bit may be set to 1 and the second bit set to 0, and so on. The Select0 input is propagated to clock path circuits 1530 and 1550, while the Select1 input is propagated to clock path circuits 1540 and 1550.

The 1510 also includes a set of inverters 1502 and 1504 arranged to logically invert the logic level of the Select0 input and Select1 input, respectively. The logically inverted outputs are designated Select0_Inv and Select1_Inv, respectively. The Select0_Inv is propagated to clock path circuits 1520 and 1540, while Select1_Inv is propagated to clock path circuits 1520 and 1530.

Referring now to FIGS. 15B and 15C, each clock path circuit includes a set of AND gates, flip-flops, and a NOR gate. For example, clock path circuit 1520 includes first AND gate 1521, which has inputs for receiving Select0_Inv and Select1_Inv from inverters 1502 and 1504. The output of first AND gate 1521 is connected to an input of second AND gate 1522. A NOR gate 1526 is connected to the other input of the second AND gate 1522. The output of the second AND gate 1522 is connected an input of a first latch or first flip-flop 1523. A first input clock signal CLK0 is input into the clock input of the first flip-flop 1523 and the startup signal is input into another input of the first flip-flop 1523. The first flip-flop 1523 may be any type of flip-flop, for example a data or delay (D) flip-flop where the input of the second AND gate 1522 is input into a data input, the startup signal input into a startup input, and the input clock signal input into a clock input. Other example flip-flops include, but are not limited to, a gated set-reset (SR) flip-flop, toggle (T) flip-flop, JK flip-flop, or the like. For example, a gated SR flip-flop may be implemented where the input of the second AND gate 1522 is input into a first input, the startup signal input into a startup input, and the input clock signal input into a clock input. The first flip-flop 1523 is connected to voltage drain VDD and voltage source VSS and the output of first flip-flop 1523 is connected the data input of second latch or second flip-flop 1524, which has a clock input connected to first input clock signal CLK0 and an input connected to the startup signal. Similar to first flip-flop 1523, second flip-flop 1524 may be any type of flip-flop and is connected to voltage drain VDD and voltage source VSS. The first and second flip-flops 1523 and 1524 function as a synchronizer to ensure that signals are captured irrespective of the source from which the signal is launched. The output of second flip-flop 1524 is multiplexer enable signal ICG_EN_A (also referred to as a multiplexer enable signal ICG_EN_A). The first input clock signal CLK0 is also connect to an input of third AND gate 1525 with the other input connected to the startup input signal, and the output of third AND gate 1525 is CLK0.

Similarly, clock path circuit 1530 includes first AND gate 1531, which has inputs for receiving Select0 from the input selection signal and Select1_Inv from inverter 1504. The output of first AND gate 1531 is connected to an input of second AND gate 1532. A NOR gate 1536 is connected to the other input of the second AND gate 1532. The output of the second AND gate 1532 is connected the data input of first latch or first flip-flop 1533. A second input clock signal CLK1 is input into the clock input of the first flip-flop 1533. For example, the first flip-flop 1533 may be a D flip-flop where the input of the second AND gate 1532 is input into a data input, the startup signal input into a startup input, and the input clock signal input into a clock input. The first flip-flop 1533 may also be any type of flip-flop as mentioned above. The first flip-flop 1533 is connected to voltage drain VDD and voltage source VSS and the output of first flip-flop 1533 is connected the data input of second latch or second flip-flop 1534, which has a clock input connected to second input clock signal CLK1 and an input connected to the startup signal. Similar to first flip-flop 1533, second flip-flop 1534 may be a D flip-flop and is connected to voltage drain VDD and voltage source VSS. The first and second flip-flops 1533 and 1524 function as a synchronizer. The output of second flip-flop 1533 is multiplexer enable signal ICG_EN_B (also referred to as a multiplexer enable signal ICG_EN_B). The second input clock signal CLK1 is also connect to an input of third AND gate 1535 with the other input connected to the startup input signal, and the output of third AND gate 1535 is CLK1.

Clock path circuit 1540 includes first AND gate 1541, which has inputs for receiving Select0_Inv from inverter 1502 and Select1 from the input selection signal. The output of first AND gate 1541 is connected to an input of second AND gate 1542. A NOR gate 1546 is connected to the other input of the second AND gate 1542. The output of the second AND gate 1542 is connected the data input of first latch or first flip-flop 1543. A third input clock signal CLK2 is input into the clock input of the first flip-flop 1543. For example, the first flip-flop 1543 may be a D flip-flop where the input of the second AND gate 1542 is input into a data input, the startup signal input into a startup input, and the input clock signal input into a clock input. The first flip-flop 1543 may also be any type of flip-flop as mentioned above. The first flip-flop 1543 is connected to voltage drain VDD and voltage source VSS and the output of first flip-flop 1543 is connected the data input of second latch or second flip-flop 1544, which has a clock input connected to third input clock signal CLK2 and an input connected to the startup signal. Similar to first flip-flop 1543, second flip-flop 1544 may be a D flip-flop and is connected to voltage drain VDD and voltage source VSS. The first and second flip-flops 1543 and 1544 function as a synchronizer. The output of second flip-flop 1543 is multiplexer enable signal ICG_EN_C (also referred to as a multiplexer enable signal ICG_EN_C). The third input clock signal CLK2 is also connect to an input of third AND gate 1545 with the other input connected to the startup input signal, and the output of third AND gate 1545 is CLK2.

Clock path circuit 1550 includes first AND gate 1551, which has inputs for receiving Select0 and Select1 from the input selection signal. The output of first AND gate 1551 is connected to an input of second AND gate 1552. A NOR gate 1556 is connected to the other input of the second AND gate 1552. The output of the second AND gate 1552 is connected the data input of first latch or first flip-flop 1553, for example, a gated set-reset (SR) flip-flop. A fourth input clock signal CLK3 is input into the clock input of the first flip-flop 1553. For example, the first flip-flop 1553 may be a D flip-flop where the input of the second AND gate 1552 is input into a data input, the startup signal input into a startup input, and the input clock signal input into a clock input. The first flip-flop 1553 may also be any type of flip-flop as mentioned above. The first flip-flop 1553 is connected to voltage drain VDD and voltage source VSS and the output of first flip-flop 1553 is connected the data input of second latch or second flip-flop 1554, which has a clock input connected to fourth input clock signal CLK3 and an input connected to the startup signal. Similar to first flip-flop 1553, second flip-flop 1554 may be a D flip-flop and is connected to voltage drain VDD and voltage source VSS.

The first and second flip-flops 1553 and 1554 function as a synchronizer. The output of second flip-flop 1553 is multiplexer enable signal ICG_EN_D (also referred to as a multiplexer enable signal ICG_EN_D). The fourth input clock signal CLK3 is also connect to an input of third AND gate 1555 with the other input connected to the startup input signal, and the output of third AND gate 1555 is CLK3.

Each NOR gate of a respective clock path circuit 1520, 1530, 1540, and 1550 is connected to the outputs of the second flips of the other clock path circuits. For example, inputs of NOR gate 1526 of clock path circuit 1520 are connected to the outputs of second flip-flops 1534, 1544, and 1554 of clock path circuits 1530, 1540, and 1550, respectively. Similarly, inputs of NOR gate 1536 are connected to the outputs of second flip-flops 1524, 1544, and 1554 of clock path circuits 1520, 1540, and 1550; inputs of NOR gate 1546 are connected to the outputs of second flip-flops 1524, 1534, and 1554 of clock path circuits 1520, 1530, and 1550; and inputs of NOR gate 1556 are connected to the outputs of second flip-flops 1524, 1534, and 1544. As noted above, the output of NOR gates 1526, 1536, 1546, and 1556 are connected to second AND gate 1522, 1532, 1542, and 1552, respectively. Thus, each NOR gate of a respective clock path circuit outputs a logic high state (e.g., 1) when all inputs of the NOR gate from of the other are at a logic low state (e.g., 0). Each second flip flop of the clock path circuits outputs a logic low state when the respective clock path circuit is deactivated. As such, based on deactivating the clock path circuits for unselected clocks, a clock path circuit of the selected clock can be activated.

Turning to FIG. 15D, outputs from clock path circuits (such as, the output of each second flip-flop 1524, 1534, 1544, and 1554 and outputs of third AND gates 1525, 1535, 1545, and 1555) are connected to multiplexer circuit 1560. The multiplexer circuit 1560 includes a set of ICGs 1527, 1537, 1547, and 1557, each corresponding to a clock path circuit 1520, 1530, 1540, and 1550 and provide for glitch free clock pass through of an input clock signal CLK0-CLK3 of the corresponding clock path circuit when change over from one clock path circuit to another occurs. Each input of each ICG 1527, 1537, 1547, and 1557 receive corresponding input clock signals CLK0-CLK3 and multiplexer enable signals ICG_EN_A through ICG_EN_D, respectively, at inputs connected to the outputs of third AND gates 1525, 1535, 1545, and 1555 and second flip-flops 1524, 1534, 1544, and 1554, respectively. For example, ICG 1527 corresponds to clock path circuit 1520, with inputs to the ICG 1527 connected to outputs of third AND gates 1525 and second flip-flop 1524. ICG 1537 corresponds to clock path circuit 1530, with inputs to the ICG 1537 connected to outputs of third AND gates 1535 and second flip-flop 1534. ICG 1547 corresponds to clock path circuit 1540, with inputs to the ICG 1547 connected to outputs of third AND gates 1545 and second flip-flop 1544. ICG 1557 corresponds to clock path circuit 1550, with inputs to the ICG 1557 connected to outputs of third AND gates 1555 and second flip-flop 1554.

Each ICG may include a negative edge triggered flip-flop or low level sensitive latch and an AND gate. For example, the data input of a negative edge triggered flip-flop of ICG 1527 can be connected to the output of the second flip-flop 1524 so to receive multiplexer enable signal ICG_EN_A. The clock input of the negative edge triggered flip-flop of ICG 1527 is connected to third AND gate 1525 so to receive the input clock signal CLK0. The output of the negative edge triggered flip-flop of ICG 1527 can be connected to an input of the AND gate of ICG 1527, with the other input connected to third AND gate 1525 to receive the input clock signal CLK0. Thus, when both input clock signal CLK0 and multiplexer enable signal ICG_EN_A are received by the ICG 1527 based on operation of the clock selection circuit 1510, the ICG 1527 outputs a global clock signal ICLK0.

Similarly, referring to ICG 1537, the data input of a negative edge triggered flip-flop of ICG 1537 can be connected to the output of the second flip-flop 1534 so to receive multiplexer enable signal ICG_EN_B. The clock input of the negative edge triggered flip-flop of ICG 1537 is connected to third AND gate 1535 so to receive the input clock signal CLK1. The output of the negative edge triggered flip-flop of ICG 1537 can be connected to an input of the AND gate of ICG 1537, with the other input connected to third AND gate 1535 to receive the input clock signal CLK1. Thus, when both input clock signal CLK1 and multiplexer enable signal ICG_EN_B are received by the ICG 1537 based on operation of the clock selection circuit 1510, the ICG 1537 outputs a global clock signal ICLK1.

Referring to ICG 1547, the data input of a negative edge triggered flip-flop of ICG 1547 can be connected to the output of the second flip-flop 1544 so to receive multiplexer enable signal ICG_EN_C. The clock input of the negative edge triggered flip-flop of ICG 1547 is connected to third AND gate 1545 so to receive the input clock signal CLK2. The output of the negative edge triggered flip-flop of ICG 1547 can be connected to an input of the AND gate of ICG 1547, with the other input connected to third AND gate 1545 to receive the input clock signal CLK2. Thus, when both input clock signal CLK2 and multiplexer enable signal ICG_EN_C are received by the ICG 1547 based on operation of the clock selection circuit 1510, the ICG 1547 outputs a global clock signal ICLK2.

Referring to ICG 1557, the data input of a negative edge triggered flip-flop of ICG 1557 can be connected to the output of the second flip-flop 1554 so to receive multiplexer enable signal ICG_EN_D. The clock input of the negative edge triggered flip-flop of ICG 1557 is connected to third AND gate 1555 so to receive the input clock signal CLK3. The output of the negative edge triggered flip-flop of ICG 1557 can be connected to an input of the AND gate of ICG 1557, with the other input connected to third AND gate 1555 to receive the input clock signal CLK3. Thus, when both input clock signal CLK3 and multiplexer enable signal ICG_EN_D are received by the ICG 1557 based on operation of the clock selection circuit 1510, the ICG 1557 outputs a global clock signal ICLK3.

While the ICGs of the multiplexer circuit 1560 are illustrated as being connected to outputs of each corresponding clock path circuit, the ICGs may be included as part of each respective clock path circuit. Thus, ICGs may be included as part of the corresponding clock path circuit, separate from corresponding clock path circuit, or a combination thereof (e.g., portions of the ICGs, such as the negative edge triggered flip-flop, may be included as part of a corresponding clock path circuit it while other portions, such as the AND gate may be separate from the corresponding clock path circuit).

The multiplexer circuit 1560 also includes a set of OR gates 1562, 1564, and 1566 configured to receive output global clock signal ICLK0-ICLK3 from the ICGs 1527, 1537, 1547, and 1557 and output a single output clock signal TM_CLK to downstream IP blocks. OR gates 1562, 1564, and 1566 may be arranged in a cascading tree structure arrangement, where a first level of OR gates receive each of the global clock signals for ICGs 1527, 1537, 1547, and 1557 and each subsequent level receives half of the number of global clock signals as the preceding level until a single global clock signal is output as the output clock signal TM_CLK.

For example, as shown in FIG. 15D, inputs of OR gate 1562 are connected to outputs of ICGs 1527 and 1537 to receive global clock signals ICLK0 and ICLK1. The output of the OR gate 1562 is connected to an input of OR gate 1566. Thus, OR gate 1562 selects the active signal between global clock signals ICLK0 and ICLK1, if any, based on operation of the clock path circuits 1520 and 1530 and outputs the selected global clock signal to OR gate 1566. Similarly, inputs of OR gate 1564 are connected to outputs of ICGs 1547 and 1557 to receive global clock signals ICLK2 and ICLK3. The output of the OR gate 1564 is connected to the other input of OR gate 1566. Thus, OR gate 1564 selects the active signal between global clock signals ICLK2 and ICLK3, if any, based on operation of the clock path circuits 1520 and 1530 and outputs the selected global clock signal to OR gate 1566. OR gate 1566 then selects the active signal between outputs from OR gate 1562 and 1564, and outputs the selected active signal as the output global clock TM_CLK.

Figure 16A:
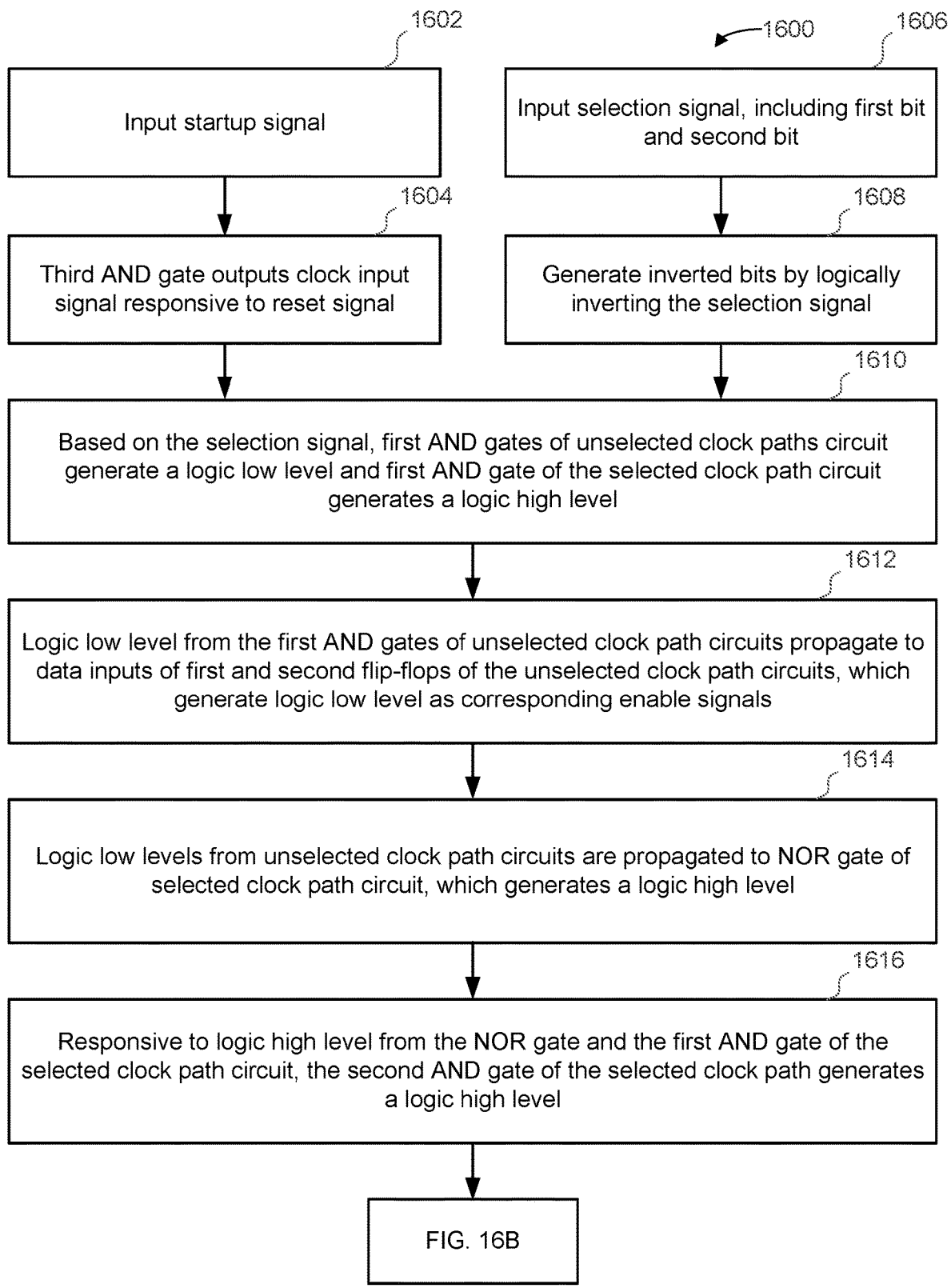
FIGS. 16A and 16B are flowcharts depicting a method of operation of a glitch-free clock multiplexer according to example embodiments of the disclosed technology.
Figure 16B:
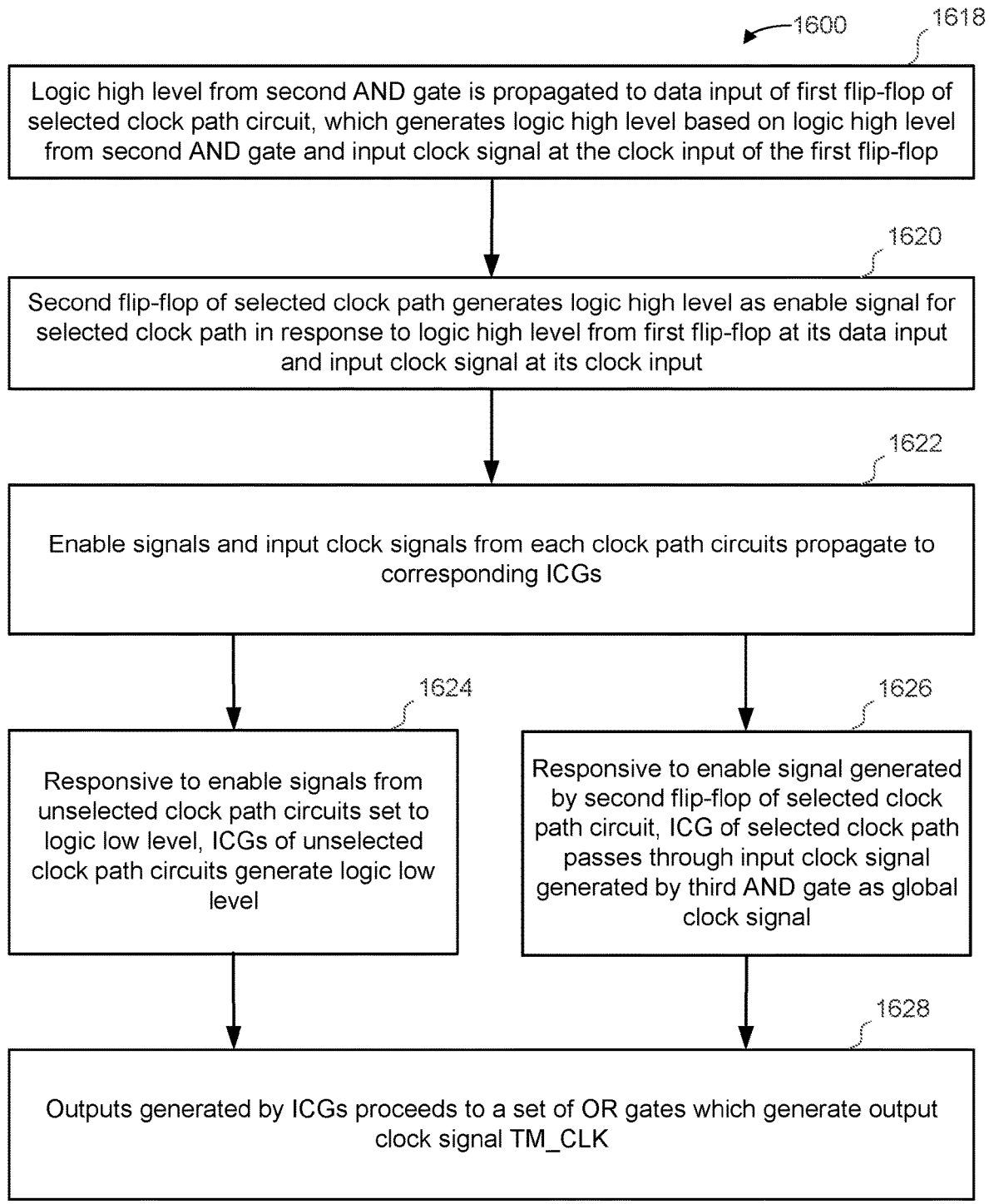

FIGS. 16A and 16B are flowcharts depicting a method of operation 1600 of a glitch-free clock multiplexer according to example embodiments of the disclosed technology. The method of operation 1600 will be described hereinafter in the context of the example circuit implementation 1500 depicted across FIGS. 15A-15D.

The method 1600 begins at block 1602 with a startup signal STARTUP input into the circuit 1500. The startup signal is input into the third AND gate 1525, 1535, 1545, and 1555; first flip-flops 1523, 1533, 1543, and 1554; second flip-flops 1524, 1534, 1544, and 1555 of clock path circuits 1520, 1530, 1540, and 1550. The third AND gates are connected to input clocks signals, 1525, 1535, 1545, and 1555 (e.g., CLK0-CLK3). Thus, at block 1604, in response to the startup signal, the third AND gates output the input clock signal to the multiplexer circuit 1560.

At block 1606 a selection signal is input to the circuit 1500, which includes a first bit, Select®, and a second bit, Select1, set to either logic low level (e.g., 0) or logic high level (e.g., 1) according to a desired clock selection. At block 1608, the selection signal is logically inverted by inverters 1502 and 1504 to generate inverted bits of the selection signal, Select0_Inv and Select1_Inv. Bits of the selection signal and logically inverted bits of the selection signal are fed to each clock path circuit 1520, 1530, 1540, and 1550.

At block 1610, based on the clock selected according to the selection signal, first AND gates of the clock path circuits corresponding to unselected clocks generate a logic low level (e.g., 0) and first AND gate of the clock path circuit of the selected clock generates a logic high level. The logic low level from the first AND gates of the unselected clock path circuits propagate to data inputs of the first and second flip-flops of the unselected clock path circuits, which both generate a logic low level as the corresponding enable signals, at block 1612. Thus, clock path circuits for the unselected clocks are deactivated (e.g., turned off in response to output of logic low level from first AND gates. For example, once a reset or startup input signal is enabled, all clocks are available. Based on the input selection signal any clock path can be enabled. This is the scenario where all clock paths are activated at the startup. Once a clock selection is received, then all clock paths are deactivated and the selected clock path will be activated. Deactivated clock paths (and their logic blocks, such as flip-flops) will not output anything. Activation in the context of embodiments disclosed herein refers to one of the AND gates 1522, 1532, 1542, or 1552 is set at logic high level, while the AND gates 1522, 1532, 1542, and 1552 remain at logic low level. Thus, the respective ICGs are OFF.

At block 1614, the logic low levels from the unselected clock path circuits are propagated to the NOR gate of clock path circuit corresponding to the selected clock. The NOR gate of the selected clock path circuit generates a logic high level that is propagated to the second AND gate of the selected clock path circuit. At block 1616, in response to the logic high level from the NOR gate and the first AND gate of the selected clock path circuit, the second AND gate of the selected clock path circuit generates a logic high level. At block 1618, the logic high level from the second AND gate is propagated to the data input of the first flip-flop of the selected clock, which generates a logic high level based on the logic high level from the second AND gate and an input clock signal at the clock input of the first flip-flop. At block 1620, the second flip-flop of the selected clock path circuit generates a logic high level as the enable signal for the selected clock path circuit in response to the logic high level from the first flip-flop at its data input and the input clock signal at its clock input.

At block 1622, the enable signals and input clock signals from each of the clock path circuits propagate to corresponding ICGs 1527, 1537, 1547, and 1557. In response to enable signals corresponding to the unselected clock path circuits set to logic low level, at block 1624, the ICGs of the unselected clock path circuits generate a logic low level. Also, at block 1626, the ICG of the selected clock path circuit passes through the input clock signal generated by the third AND gate, in response to the enable signal generated by the second flip-flop of the corresponding clock path circuit, as a global clock signal. At block 1628, the outputs generated by the ICGs proceeds to OR gates which generate the output clock signal TM_CLK. For example, a first OR gate receive the global clock signal from the ICG of the selected clock and logic low level of one generated by an ICG of the unselected clock path circuit and generates an output of the global clock signal. A second OR gate receives the logic low levels from the two ICGs of unselected clocks, and outputs a logic low level. A third OR gate receives the global clock signal from the first OR gate and the logic low level from the second OR gate, and generates the output clock signal TM_CLK.

As a first example of method 1600, presume CLK0 is 5 GHZ, CLK1 is 2.5 GHz, CLK2 is 1.25 GHz, and CLK3 is 0.625 Ghz and CLK0 is selected. In this case, the startup signal is turned on (block 1602) and the CLK0 selected by setting both the first bit and second bit of the selection signal to logic low level (e.g., 0) (block 1606). The third AND gates 1525, 1535, 1545, and 1555 output the input clock signals CLK0-CLK3 to the multiplexer circuit 1560 (block 1604). The selection signal is logically inverted by inverters 1502 and 1504 to generate logic high levels as Select0_Inv and Select1_Inv (block 1608). Thus, first AND gates 1531, 1541, and 1551 generate a logic low level (e.g., 0) such that clock path circuits 1530, 1540, and 1550 are turned off, while first AND gate 1521 generates a logic high level (block 1610). The first flip-flops 1533, 1543, and 1553 and second flip-flops 1534, 1544, and 1554 generate logic low levels as the enable signals ICG_EN_B through ICG_EN_D (block 1612). The logic low levels of the enable signals ICG_EN_B through ICG_EN_D are propagated to the NOR gate 1526 of clock path circuit 1520 (block 1614), which generates a logic high level propagated to the second AND gate 1522. The second AND gate 1522 generates a logic high level (block 1616), which triggers the first flip-flop 1523 to generate a logic high level (block 1618) and the second flip-flop 1524 to generate a logic high level as the enable signal ICG_EN_A (block 1620).

The enable signals ICG_EN_A through ICG_EN_D and input clock signals CLK0-CLK3 propagates to corresponding ICGs 1527, 1537, 1547, and 1557 (block 1622). Based on enable signals ICG_EN_B through ICG_EN_D set as logic low level, the ICGs 1537, 1547, and 1557 generate a logic low level, while ICG 1527 passes through the input clock signal CLK0 as a global clock signal ICLK0 (blocks 1624 and 1626). OR gate 1562 receives the global clock signal ICLK0 and a logic low level generated by ICG 1537 and outputs of the global clock signal ICLK0. OR gate 1564 receives the logic low levels from the ICGs 1547 and 1557, and outputs a logic low level. OR gate 1566 receives the global clock signal ICLK0 from OR gate 1562 and the logic low level from the OR gate 1564, and outputs clock signal TM_CLK (block 1628). Since CLK0 is 5 GHz, the output clock signal TM_CLK is 5 GHz.

As a second example of method 1600, presume CLK0 is 5 GHZ, CLK1 is 2.5 GHz, CLK2 is 1.25 GHz, and CLK3 is 0.625 Ghz and CLK1 is selected. In this case, the startup signal is turned on (block 1602) and the CLK1 selected by setting the first bit of the selection signal to logic high level (e.g., 1) and second bit of the selection signal to logic low level (e.g., 0) (block 1606). The third AND gates 1525, 1535, 1545, and 1555 output the input clock signals CLK0-CLK3 to the multiplexer circuit 1560 (block 1604). The selection signal is logically inverted by inverters 1502 and 1504 to generate logic low level as Select0_Inv and logic high level as Select1_Inv (block 1608). Thus, first AND gates 1521, 1541, and 1551 generate a logic low level (e.g., 0) such that clock path circuits 1520, 1540, and 1550 are turned off, while first AND gate 1531 generates a logic high level (block 1610). The first flip-flops 1523, 1543, and 1553 and second flip-flops 1524, 1544, and 1554 generate logic low levels as the enable signals ICG_EN_A, ICG_EN_C, and ICG_EN_D (block 1612). The logic low levels of the enable signals ICG_EN_A, ICG_EN_C, and ICG_EN_D are propagated to the NOR gate 1536 of clock path circuit 1530 (block 1614), which generates a logic high level propagated to the second AND gate 1532. The second AND gate 1532 generates a logic high level (block 1616), which triggers the first flip-flop 1533 to generate a logic high level (block 1618) and the second flip-flop 1534 to generate a logic high level as the enable signal ICG_EN_B (block 1620).

The enable signals ICG_EN_A through ICG_EN_D and input clock signals CLK0-CLK3 propagates to corresponding ICGs 1527, 1537, 1547, and 1557 (block 1622). Based on enable signals ICG_EN_A, ICG_EN_C, and ICG_EN_D set as logic low level, the ICGs 1527, 1547, and 1557 generate a logic low level, while ICG 1537 passes through the input clock signal CLK1 as a global clock signal ICLK1 (blocks 1624 and 1626). OR gate 1562 receives the global clock signal ICLK1 and a logic low level generated by ICG 1527 and outputs of the global clock signal ICLK1. OR gate 1564 receives the logic low levels from the ICGs 1547 and 1557, and outputs a logic low level. OR gate 1566 receives the global clock signal ICLK1 from OR gate 1562 and the logic low level from the OR gate 1564, and outputs clock signal TM_CLK (block 1628). Since CLK1 is 2.5 GHz, the output clock signal TM_CLK is 2.5 GHz.

As a third example of method 1600, presume CLK0 is 5 GHz, CLK1 is 2.5 GHz, CLK2 is 1.25 GHz, and CLK3 is 0.625 Ghz and CLK2 is selected. In this case, the startup signal is turned on (block 1602) and the CLK2 selected by setting the first bit of the selection signal to logic low level (e.g., 0) and second bit of the selection signal to logic high level (e.g., 1) (block 1606). The third AND gates 1525, 1535, 1545, and 1555 output the input clock signals CLK0-CLK3 to the multiplexer circuit 1560 (block 1604). The selection signal is logically inverted by inverters 1502 and 1504 to generate logic high level as Select0_Inv and logic low level as Select1_Inv (block 1608). Thus, first AND gates 1521, 1531, and 1551 generate a logic low level (e.g., 0) such that clock path circuits 1520, 1530, and 1550 are turned off, while first AND gate 1541 generates a logic high level (block 1610). The first flip-flops 1523, 1533, and 1553 and second flip-flops 1524, 1534, and 1554 generate logic low levels as the enable signals ICG_EN_A, ICG_EN_B, and ICG_EN_D (block 1612). The logic low levels of the enable signals ICG_EN_A, ICG_EN_B, and ICG_EN_D are propagated to the NOR gate 1546 of clock path circuit 1540 (block 1614), which generates a logic high level propagated to the second AND gate 1542. The second AND gate 1542 generates a logic high level (block 1616), which triggers the first flip-flop 1543 to generate a logic high level (block 1618) and the second flip-flop 1544 to generate a logic high level as the enable signal ICG_EN_C (block 1620).

The enable signals ICG_EN_A through ICG_EN_D and input clock signals CLK0-CLK3 propagates to corresponding ICGs 1527, 1537, 1547, and 1557 (block 1622). Based on enable signals ICG_EN_A, ICG_EN_B, and ICG_EN_D set as logic low level, the ICGs 1527, 1537, and 1557 generate a logic low level, while ICG 1547 passes through the input clock signal CLK2 as a global clock signal ICLK2 (blocks 1624 and 1626). OR gate 1562 receives logic low levels generated by ICGs 1527 and 1537 and outputs a logic low level. OR gate 1564 receives the global clock signal ICLK2 and the logic low level from ICG 1557, and outputs a global clock ICLK2. OR gate 1566 receives the global clock signal ICLK2 from OR gate 1564 and the logic low level from the OR gate 1562, and outputs clock signal TM_CLK (block 1628). Since CLK2 is 1.25 GHz, the output clock signal TM_CLK is 1.25 GHz.

As a fourth example of method 1600, presume CLK0 is 5 GHZ, CLK1 is 2.5 GHz, CLK2 is 1.25 GHz, and CLK3 is 0.625 Ghz and CLK3 is selected. In this case, the startup signal is turned on (block 1602) and the CLK3 selected by setting both the first and second bit of the selection signal to logic high level (e.g., 1) (block 1606). The third AND gates 1525, 1535, 1545, and 1555 output the input clock signals CLK0-CLK3 to the multiplexer circuit 1560 (block 1604). The selection signal is logically inverted by inverters 1502 and 1504 to generate logic low level as Select0_Inv and Select1_Inv (block 1608). Thus, first AND gates 1521, 1531, and 1541 generate a logic low level (e.g., 0) such that clock path circuits 1520, 1530, and 1540 are turned off, while first AND gate 1551 generates a logic high level (block 1610). The first flip-flops 1523, 1533, and 1543 and second flip-flops 1524, 1534, and 1544 generate logic low levels as the enable signals ICG_EN_A through ICG_EN_C (block 1612). The logic low levels of the enable signals ICG_EN_A through ICG_EN_C are propagated to the NOR gate 1556 of clock path circuit 1550 (block 1614), which generates a logic high level propagated to the second AND gate 1552. The second AND gate 1552 generates a logic high level (block 1616), which triggers the first flip-flop 1553 to generate a logic high level (block 1618) and the second flip-flop 154 to generate a logic high level as the enable signal ICG_EN_D (block 1620).

The enable signals ICG_EN_A through ICG_EN_D and input clock signals CLK0-CLK3 propagates to corresponding ICGs 1527, 1537, 1547, and 1557 (block 1622). Based on enable signals ICG_EN_A through ICG_EN_C set as logic low level, the ICGs 1527, 1537, and 1547 generate a logic low level, while ICG 1557 passes through the input clock signal CLK3 as a global clock signal ICLK3 (blocks 1624 and 1626). OR gate 1562 receives logic low levels generated by ICGs 1527 and 1537 and outputs a logic low level. OR gate 1564 receives the global clock signal ICLK3 and the logic low level from ICG 1547, and outputs a global clock ICLK3. OR gate 1566 receives the global clock signal ICLK3 from OR gate 1564 and the logic low level from the OR gate 1562, and outputs clock signal TM_CLK (block 1628). Since CLK2 is 0.625 GHz, the output clock signal TM_CLK is 0.625 GHz.

As a fifth example of method 1600, presume CLK0 is 5 GHZ and CLK1-CLK3 0 and CLK0 is selected. In this case, as in the first example above, the startup signal is turned on (block 1602) and the CLK0 selected by setting both the first bit and second bit of the selection signal to logic low level (e.g., 0) (block 1606). The third AND gates 1525, 1535, 1545, and 1555 output the input clock signals CLK0-CLK3 to the multiplexer circuit 1560 (block 1604). The selection signal is logically inverted by inverters 1502 and 1504 to generate logic high levels as Select0_Inv and Select1_Inv (block 1608). Thus, first AND gates 1531, 1541, and 1551 generate a logic low level (e.g., 0) such that clock path circuits 1530, 1540, and 1550 are turned off, while first AND gate 1521 generates a logic high level (block 1610). The first flip-flops 1533, 1543, and 1553 and second flip-flops 1534, 1544, and 1554 generate logic low levels as the enable signals ICG_EN_B through ICG_EN_D (block 1612). The logic low levels of the enable signals ICG_EN_B through ICG_EN_D are propagated to the NOR gate 1526 of clock path circuit 1520 (block 1614), which generates a logic high level propagated to the second AND gate 1522. The second AND gate 1522 generates a logic high level (block 1616), which triggers the first flip-flop 1523 to generate a logic high level (block 1618) and the second flip-flop 1524 to generate a logic high level as the enable signal ICG_EN_A (block 1620).

The enable signals ICG_EN_A through ICG_EN_D and input clock signals CLK0-CLK3 propagates to corresponding ICGs 1527, 1537, 1547, and 1557 (block 1622). Based on enable signals ICG_EN_B through ICG_EN_D set as logic low level, the ICGs 1537, 1547, and 1557 generate a logic low level, while ICG 1527 passes through the input clock signal CLK0 as a global clock signal ICLK0 (blocks 1624 and 1626). The OR gates generate output clock signal TM_CLK as 5 GHz (block 1628). If one of CLK1-CLK3 is selected, method 1600 would proceed similar to examples two though five above and generate an output clock signal TM_CLK as 0.

Figure 17:
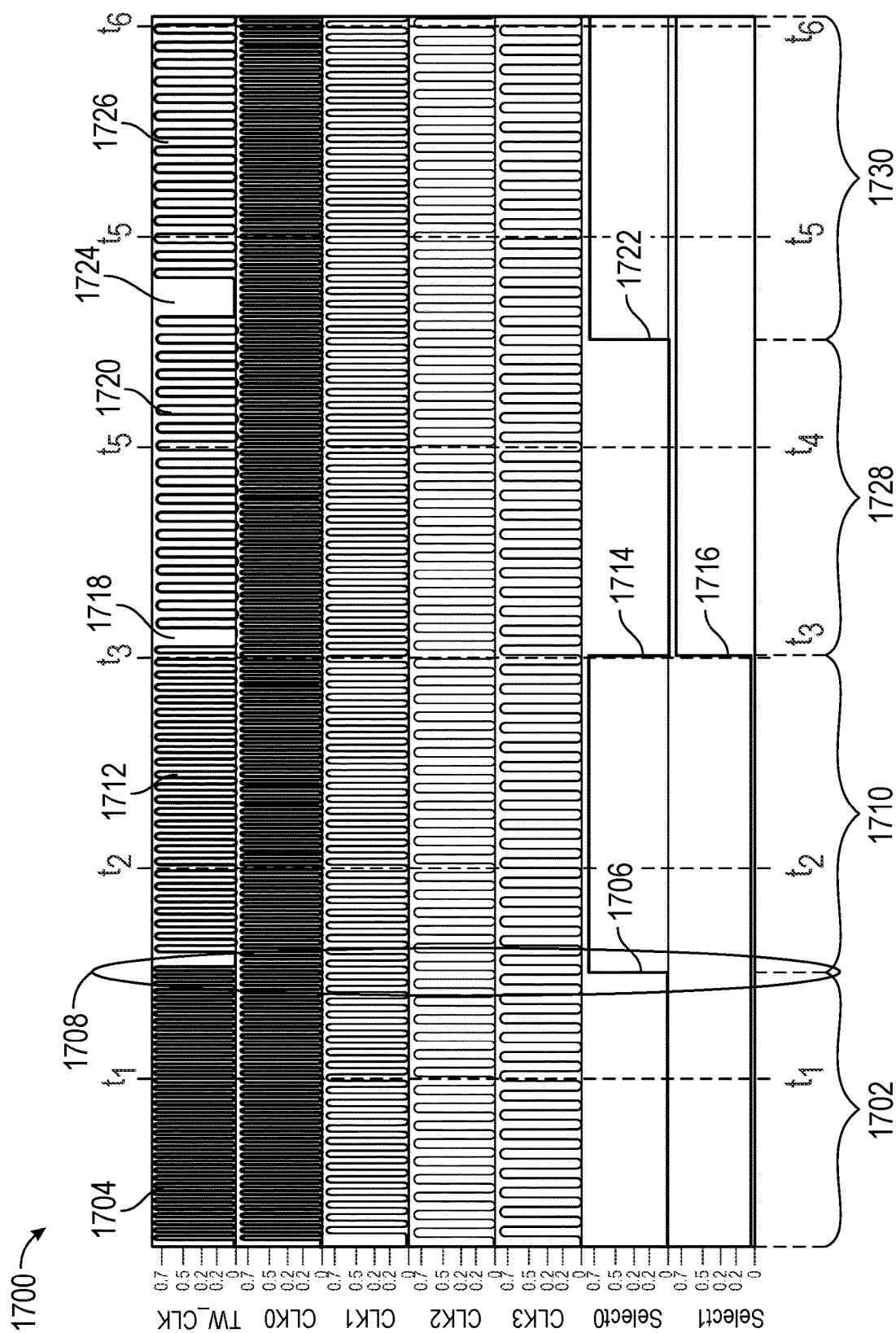
FIGS. 17 and 18 are timing diagrams illustrating simulation results of a glitch-free clock multiplexer according to example embodiments of the disclosed technology.

FIG. 17 is a timing diagram 1700 illustrating the simulation results of the circuit 1500 according to according to example embodiments of the disclosed technology. FIG. 17 shows various signals, and relevant events are marked with reference numerals 1702-1730. Similar to the first through fourth examples above, CLK0 is 5 GHZ, CLK1 is 2.5 GHz, CLK2 is 1.25 GHz, and CLK3 is 0.625 Ghz. It can be seen that for a first time period (702) bits of the selection signal are set to low (Select0 and Select1) is set to low (e.g., 1), thereby selecting CLK0. As described in the first example above, during the first time period 1702, the circuit 1500 generates output clock signal TM_CLK as 5 GHz (704). Then, a clock change is initiated by changing the first bit of selection signal by setting Select0 to high (706), thereby selecting CLK1 as in the second example. As described in the second example above, during the second time period 1710, the circuit 1500 generates output clock signal TM_CLK as 2.5 GHz (712). Next, a second clock change is initiated by changing the first bit of selection signal by setting Select0 to low (715) and the second bit by setting Select1 to high (716), thereby selecting CLK2 as in the third example. As described in the third example above, during the third time period 1728, the circuit 1500 generates output clock signal TM_CLK as 1.25 GHz (720). Lastly, a third clock change is initiated by changing the first bit of selection signal by setting Select0 to high (722), thereby selecting CLK3 as in the fourth example. As described in the fourth example above, during the fourth time period 1730, the circuit 1500 generates output clock signal TM_CLK as 0.625 GHz (726).

Additionally, following each change in the selection signal to select a different clock a settle period is provided prior to effectuating the change to the selected clock. For example, the change from CLK0 to CLK1 includes settler period 1708; the change from CLK1 to CLK0 includes settler period 1718; and the change from CLK2 to CLK3 includes settler period 1724. The settle period is provided so that the clock change can settle. For example, the settle period permits the enable signals of unselected clock path circuits are set to 0, including changing the enable signal of the previously selected clock to transition to 0. Once the enable signals of unselected clock path circuits are 0, the settle period also permits the NOR gate of the selected clock path circuit to output 1 to the second AND gate such that the enable signal of the selected clock path circuit is transitioned from 0 (e.g., previously unselected) to 1. The enable signal of the selected path is provided to the multiplexer circuit 1560, which effectuates the clock change during the settle period. In various embodiments, the settle period may be 2 periods of the faster of the previously selected clock and the selected clock (e.g., the clocks being change from and the clock being changed to). Thus, as shown in FIG. 17, the settle period of each clock change is longer than the previous one due to changing to a slower clock. In this illustrative example, the 5 Ghz clock provides a minimum settle period of 1400 ps. A faster clock may provide for a faster settle period.

The settle period due to deactivating clock path circuits of unselected clocks and activating the clock path circuit of a selected clock, helps in resolution of the selection signal before executing a lock switch decision. For example, when selection signal indicates a change from CLK1 to CLK3, the clock path circuit for CLK1 is turned off (e.g., setting ICG_EN_B to logic low level) within the settle period (e.g., 2 clock cycles) and then activating only CLK3 (e.g., setting ICG_EN_D to logic high level). Any skew or noise occurring due to the changeover, which can corrupt selection control, resolves itself within the 2 clock cycles of the settle period, thus keeping clock output (TM_CLK) consistent.

Additionally, the clock change to CLK3 involves setting both bits of the selection signal to a logic high level. Thus, circuit 1500 is robust to noisy environments, at least because circuit 1500 is able to resolve situations in which both bits of the selection signal are in the high level. Thus, effects of noisy environments inadvertently producing a high level in one or the other bits will not cause failure in the selection signal nor circuit 1500, at least because a clock is defined for this situation.

Figure 18:
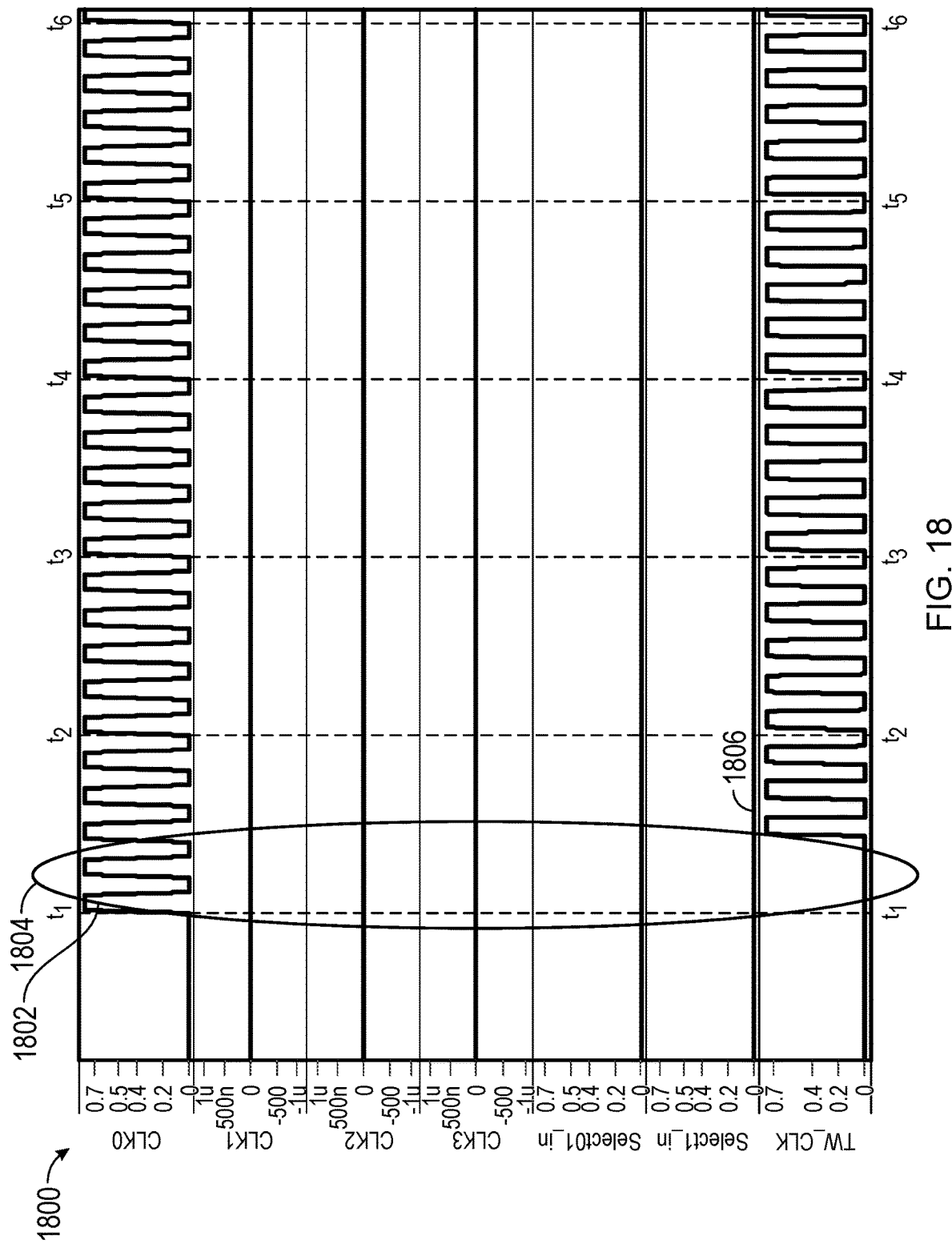

FIG. 18 is a timing diagram 1800 illustrating the simulation results of the circuit 1500 according to example embodiments of the disclosed technology. FIG. 18 shows various signals, and relevant events are marked with reference numerals 1802-1806. Similar to the fifth example above, CLK0 is 5 GHz (802) and CLK1-CLK3 are 0. It can be seen that bits of the selection signal are set to low (Select0 and Select1) is set to low (e.g., 1), thereby selecting CLK0. As described in the fifth example above, the circuit 1500 generates output clock signal TM_CLK as 5 GHz (806). Thus, as shown in FIG. 18, the circuit 1500 is not dependent on a reference clock and can support any clock path circuit after startup.

Figure 19:
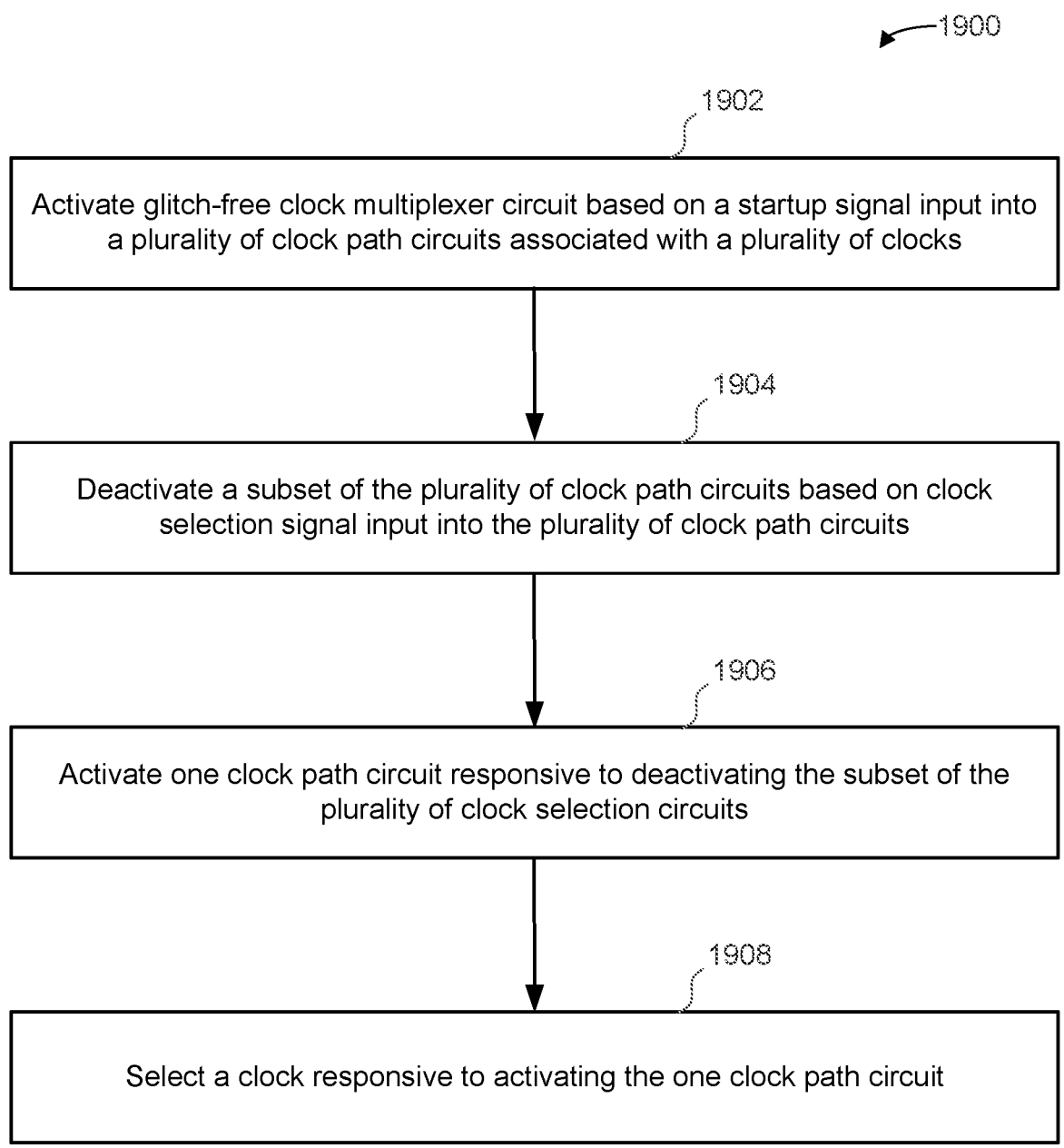
FIG. 19 is a flowchart depicting a method for glitch-free clock multiplexing according to example embodiments of the disclosed technology.

FIG. 19 is a flowchart depicting a method 1900 for glitch-free multiplexing according to example embodiments of the disclosed technology. The method 1900 will be described hereinafter in the context of the example circuit implementation 1500 depicted across FIGS. 15A-15D.

The method 1900 begins at block 1904, where a glitch-free clock multiplexer is activated based on a startup signal input into each of a plurality of clock path circuits each associated with a clock of a plurality of clocks. For example, a startup signal is received by circuit 1500 and input into each clock path circuit 1520, 1530, 1540, and 1500, such as into respective third AND gate, first latch (or flip-flop) and second latch (or flip-flop). As described above, activating the glitch-free clock multiplexer circuit causes the plurality of clocks to be provided to a multiplexer circuit (e.g., multiplexer circuit 1560) responsive to the startup signal, for example, by third AND gate of each clock path circuit.

At block 1904, a subset of the plurality of clock path circuits are deactivated based on a clock selection signal input into the plurality of clock path circuits. For example, based on bits set in a selection signal (e.g., Select0 and Select1) and logically inverted bits (e.g., Select0_Inv and Select1_Inv) from inverters 1502 and 1504, clock path circuits of the unselected clocks (e.g., the subset of clock path circuits) are deactivated by respective first AND gates. This causes each clock path circuit of the unselected clocks to output an enable signal (e.g., one of ICG_EN_A through ICG_EN_D) to the multiplexer circuit 1560, for example, by setting respective enable signals at a logic low level At block 1906, one of the plurality of clock path circuits is activated responsive to deactivating the subset of the plurality of clock path circuits. For example, the clock path circuit of the selected clock (e.g., the one of the plurality of clock path circuits) is receives the enable signals from the clock path circuits of unselected clocks, for example, at its respective NOR gate. Based on the enable signals, the second AND gate of the clock path circuit of the selected clock activates the clock path circuit and causes an enable signal to be set at a logic high level (e.g., as output by the second latch or flip-flop).

At block 1908, a clock from the plurality of clocks is selected responsive to activating the one of the plurality of clock path circuits. For example, enable signals from each clock path circuit are provided to the multiplexer circuit 1560, including the logic high level from the clock path circuit of the selected clock and the logic low levels from the clock path circuit of the unselected clocks. Based on the enable signals, the multiplexer circuit 1560 (e.g., via ICGs 1527, 1537, 1547, and 1557 and OR gates 1562, 1564, and 1566) pass through the clock from the third AND gate of clock path circuit of the selected clock and outputs the passed through clock as a clock output signal.

Aspects of the present disclosure may be embodied as an apparatus, system, method, or computer program product. Accordingly, aspects of the present disclosure may take the form of an entirely hardware embodiment, an entirely software embodiment (including firmware, resident software, micro-code, or the like) or an embodiment combining software and hardware aspects that may all generally be referred to herein as a "circuit," "module," "apparatus," or "system." Furthermore, aspects of the present disclosure may take the form of a computer program product embodied in one or more non-transitory computer readable storage media storing computer readable and/or executable program code.

Many of the functional units described in this specification have been labeled as modules, in order to more particularly emphasize their implementation independence. For example, a module may be implemented as a hardware circuit comprising custom VLSI circuits or gate arrays, off-the-shelf semiconductors such as logic chips, transistors, or other discrete components. A module may also be implemented in programmable hardware devices such as field programmable gate arrays, programmable array logic, programmable logic devices, or the like.

Modules may also be implemented at least partially in software for execution by various types of processors. An identified module of executable code may, for instance, comprise one or more physical or logical blocks of computer instructions which may, for instance, be organized as an object, procedure, or function. Nevertheless, the executables of an identified module need not be physically located together, but may comprise disparate instructions stored in different locations which, when joined logically together, comprise the module and achieve the stated purpose for the module.

Indeed, a module of executable code may include a single instruction, or many instructions, and may even be distributed over several different code segments, among different programs, across several memory devices, or the like. Where a module or portions of a module are implemented in software, the software portions may be stored on one or more computer readable and/or executable storage media. Any combination of one or more computer readable storage media may be utilized. A computer readable storage medium may include, for example, but not limited to, an electronic, magnetic, optical, electromagnetic, infrared, or semiconductor system, apparatus, or device, or any suitable combination of the foregoing, but would not include propagating signals. In the context of this document, a computer readable and/or executable storage medium may be any tangible and/or non-transitory medium that may contain or store a program for use by or in connection with an instruction execution system, apparatus, processor, or device.

Computer program code for carrying out operations for aspects of the present disclosure may be written in any combination of one or more programming languages, including an object oriented programming language such as Python, Java, Smalltalk, C++, C #, Objective C, or the like, conventional procedural programming languages, such as the "C" programming language, scripting programming languages, and/or other similar programming languages. The program code may execute partly or entirely on one or more of a user's computer and/or on a remote computer or server over a data network or the like.

A component, as used herein, comprises a tangible, physical, non-transitory device. For example, a component may be implemented as a hardware logic circuit comprising custom VLSI circuits, gate arrays, or other integrated circuits; off-the-shelf semiconductors such as logic chips, transistors, or other discrete devices; and/or other mechanical or electrical devices. A component may also be implemented in programmable hardware devices such as field programmable gate arrays, programmable array logic, programmable logic devices, or the like. A component may comprise one or more silicon integrated circuit devices (e.g., chips, die, die planes, packages) or other discrete electrical devices, in electrical communication with one or more other components through electrical lines of a printed circuit board (PCB) or the like. Each of the modules described herein, in certain embodiments, may alternatively be embodied by or implemented as a component.

A circuit, as used herein, comprises a set of one or more electrical and/or electronic components providing one or more pathways for electrical current. In certain embodiments, a circuit may include a return pathway for electrical current, so that the circuit is a closed loop. In another embodiment, however, a set of components that does not include a return pathway for electrical current may be referred to as a circuit (e.g., an open loop). For example, an integrated circuit may be referred to as a circuit regardless of whether the integrated circuit is coupled to ground (as a return pathway for electrical current) or not. In various embodiments, a circuit may include a portion of an integrated circuit, an integrated circuit, a set of integrated circuits, a set of non-integrated electrical and/or electrical components with or without integrated circuit devices, or the like. In one embodiment, a circuit may include custom VLSI circuits, gate arrays, logic circuits, or other integrated circuits; off-the-shelf semiconductors such as logic chips, transistors, or other discrete devices; and/or other mechanical or electrical devices. A circuit may also be implemented as a synthesized circuit in a programmable hardware device such as field programmable gate array, programmable array logic, programmable logic device, or the like (e.g., as firmware, a netlist, or the like). A circuit may comprise one or more silicon integrated circuit devices (e.g., chips, die, die planes, packages) or other discrete electrical devices, in electrical communication with one or more other components through electrical lines of a printed circuit board (PCB) or the like. Each of the modules described herein, in certain embodiments, may be embodied by or implemented as a circuit.

Reference throughout this specification to "one embodiment," "an embodiment," or similar language means that a particular feature, structure, or characteristic described in connection with the embodiment is included in at least one embodiment of the present disclosure. Thus, appearances of the phrases "in one embodiment," "in an embodiment," and similar language throughout this specification may, but do not necessarily, all refer to the same embodiment, but mean "one or more but not all embodiments" unless expressly specified otherwise. The terms "including," "comprising," "having," and variations thereof mean "including but not limited to" unless expressly specified otherwise. An enumerated listing of items does not imply that any or all of the items are mutually exclusive and/or mutually inclusive, unless expressly specified otherwise. The terms "a," "an," and "the" also refer to "one or more" unless expressly specified otherwise.

Aspects of the present disclosure are described below with reference to schematic flowchart diagrams and/or schematic block diagrams of methods, apparatuses, systems, and computer program products according to embodiments of the disclosure. It will be understood that each block of the schematic flowchart diagrams and/or schematic block diagrams, and combinations of blocks in the schematic flowchart diagrams and/or schematic block diagrams, can be implemented by computer program instructions. These computer program instructions may be provided to a processor of a computer or other programmable data processing apparatus to produce a machine, such that the instructions, which execute via the processor or other programmable data processing apparatus, create means for implementing the functions and/or acts specified in the schematic flowchart diagrams and/or schematic block diagrams block or blocks.

It should also be noted that, in some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. Other steps and methods may be conceived that are equivalent in function, logic, or effect to one or more blocks, or portions thereof, of the illustrated figures. Although various arrow types and line types may be employed in the flowchart and/or block diagrams, they are understood not to limit the scope of the corresponding embodiments. For instance, an arrow may indicate a waiting or monitoring period of unspecified duration between enumerated steps of the depicted embodiment.

In the following detailed description, reference is made to the accompanying drawings, which form a part thereof. The foregoing summary is illustrative only and is not intended to be in any way limiting. In addition to the illustrative aspects, embodiments, and features described above, further aspects, embodiments, and features will become apparent by reference to the drawings and the following detailed description. The description of elements in each figure may refer to elements of proceeding figures. Like numbers may refer to like elements in the figures, including alternate embodiments of like elements.

What is claimed is:

1. A glitch-free clock multiplexer, comprising:
    a plurality of clock path circuits each connected to an input clock signal of a plurality of input clock signals, wherein each of the plurality of clock path circuits is configured to output a respective input clock signal based on the respective input clock signal and a startup signal, the plurality of clock path circuits comprising:
        one or more first clock path circuits configured to output a logic low level based on a selection signal;
        a second clock path circuit configured to output a logic high level based on the selection signal and the logic low levels from the one or more first clock path circuits; and
    a multiplexer circuit connected to the plurality of clock path circuits and configured to select between the plurality of input clock signals based on the logic high level from the second clock path circuit and logic low levels from the one or more first clock path circuits.

2. The glitch-free clock multiplexer of claim 1, wherein each of the plurality of clock path circuits comprises:
    a first AND gate configured to receive the selection signal as inputs;
    a second AND gate configured to receive an output from the first AND gate as a first input;
    one or more flip-flops configured to receive the output from the second AND gate as a first input, a startup signal as a second input, and the respective input clock signal as a third input;
    a NOR gate configured to receive outputs from the one or more flip-flops of other clock path circuits of the plurality of clock path circuits, wherein the second AND gate is configured to receive an output from the NOR gate as a second input; and
    a third AND gate configured to output the respective input clock signal based on the respective input clock signal and the startup signal as inputs, wherein the multiplexer circuit is configured to receive input clock signals from each third AND gate and outputs from each one or more flop flops.

3. The glitch-free clock multiplexer of claim 2, wherein the first AND gate, of the one or more first clock path circuits, is configured to output a logic low level based on the selection signal input into the first AND gate;

the second AND gate, of the one or more first clock path circuits, is configured to output a logic low level based, in part, on the output from the first AND gate; and the one or more flip-flops, of the one or more first clock path circuits, is configured to output a logic low level based on the output from the second AND gate.

4. The glitch-free clock multiplexer of claim 2, wherein the first AND gate, of the second clock path circuit, is configured to output a logic high level based on the selection signal input into the first AND gate;

the second AND gate, of the second clock path circuit, is configured to output a logic high level based, in part, on the output from the first AND gate;

the one or more flip-flops, of the second clock path circuit, is configured to output a logic high level based on the output from the second AND gate; and the NOR gate, of the second clock path circuit, is configured to output a logic high level based on outputs from the one or more flip-flops of the one or more first clock path circuits, wherein the logic high level output by the second AND gate is based on the logic high level from the NOR gate.

5. The glitch-free clock multiplexer of claim 2, further comprising a plurality of logical inverters configured to logically invert the selection signal, wherein the first AND gate of the plurality of clock path circuits are configured to output a logic low level or logic high level based on the selection signal and the logically inverted selection signal as input into the first AND gates.

6. The glitch-free clock multiplexer of claim 2, wherein the one or more flip-flops comprises:

a first flip-flop to receive the output from the second AND gate as a first input, the startup signal as a second input, and the respective input clock signal as a third input; and a second flip-flop to receive the output from the first flip-flop as a first input, the startup signal as a second input, and the respective input clock signal as a third input.

7. The glitch-free clock multiplexer of claim 1, wherein the plurality of clock path circuits are activated responsive to a startup signal as an input into each of the plurality of clock path circuits.

8. The glitch-free clock multiplexer of claim 1, wherein the multiplexer circuit comprises:

a plurality of integrated clock gaters connected to the plurality of clock path circuits, wherein an integrated clock gater is enabled based on the logic high level output from the second clock path circuit, and wherein the integrated clock gater outputs the input clock signal of the second clock path circuit and remaining integrated clock gaters output a logic low level.

9. The glitch-free clock multiplexer of claim 8, wherein the multiplexer circuit comprises a plurality of OR gates connected to the plurality of integrated clock gaters, the plurality of OR gates configured to output the input clock signal of the second clock path circuit as an output clock signal.

10. A method comprising:

activating a glitch-free clock multiplexer circuit based on a startup signal input into each of a plurality of clock path circuits each associated with a clock of a plurality of clocks, wherein activating the glitch-free clock multiplexer circuit causes the plurality of clocks to be provided to a multiplexer circuit responsive to the startup signal;

deactivating a subset of the plurality of clock path circuits based on a clock selection signal input into the plurality of clock path circuits;

activating one of the plurality of clock path circuits responsive to deactivating the subset of the plurality of clock path circuits; and selecting a clock from the plurality of clocks responsive to activating the one of the plurality of clock path circuits.

11. The method of claim 10, wherein activating the glitch-free clock multiplexer circuit comprises inputting the startup signal to at least one latch of each of the plurality of clock path circuits.

12. The method of claim 10, further comprises outputting, by each of the plurality of clock path circuits, an enable signal to the multiplexer circuit, wherein the selected clock is based on the enable signals from the plurality of clock path circuits.

13. The method of claim 12, wherein the subset of the plurality of clock path circuits output a logic low level as a respective enable signal and the one of the plurality of clock path circuits outputs a logic high level as a respective enable signal.

14. The method of claim 13, wherein the multiplexer circuit comprises a plurality of integrated clock gaters each corresponding to a clock path circuit of the plurality of clock path circuits, wherein an integrated clock gater corresponding to the one of the plurality of clock path circuits outputs the clock of the one of the plurality of clock path circuits responsive to the logic high level from the one of the plurality of clock path circuits.

15. The method of claim 12, wherein activating the one of the plurality of clock path circuits is responsive to the respective enable signals output by the subset of the plurality of clock path circuits.

16. The method of claim 10, further comprising:

receiving the clock selection signal as bits indicative of the selected clock;

logically inverting the bits of the clock selection signal; and providing one or more of the bits and the logically inverted bits as inputs to each of the plurality of clock path circuits.

17. An integrated circuit, comprising:

a clock selection circuit comprising a plurality of clock path circuits each associated with a clock of a plurality of clocks, the clock selection circuit configured to output a multiplexer enable signal based on activating one clock path circuit of the plurality clock path circuits based on a clock selection signal and responsive to deactivating each remaining clock path circuits of the plurality of clock path circuits; and a clock multiplexer circuit connected to the clock selection circuit configured to generate an output clock signal by selecting one of the plurality of clocks based on receiving the multiplexer enable signal from the one clock path circuit, wherein the plurality of clocks are provided to the clock multiplexer circuit responsive to a startup signal.

18. The integrated circuit of claim 17, wherein the remaining clock path circuits are deactivated based on the clock selection signal and set corresponding multiplexer enable signals of each of the remaining clock path circuits to a logic low level.

19. The integrated circuit of claim 17, wherein the plurality of clock path circuits is activated responsive to the startup signal.

* * * * *